United States Patent
Kamiguchi

(10) Patent No.: US 11,762,049 B2
(45) Date of Patent: Sep. 19, 2023

(54) MEDICAL DATA PROCESSING APPARATUS, MEDICAL DATA PROCESSING METHOD, AND MAGNETIC RESONANCE IMAGING APPARATUS

(71) Applicant: Canon Medical Systems Corporation, Otawara (JP)

(72) Inventor: Yuuzo Kamiguchi, Yokohama (JP)

(73) Assignee: Canon Medical Systems Corporation, Otawara (JP)

( * ) Notice: Subject to any disclaimer, the term of this patent is extended or adjusted under 35 U.S.C. 154(b) by 441 days.

(21) Appl. No.: 16/912,034

(22) Filed: Jun. 25, 2020

(65) Prior Publication Data

US 2021/0003651 A1    Jan. 7, 2021

(30) Foreign Application Priority Data

Jul. 3, 2019  (JP) ................................. 2019-124695

(51) Int. Cl.
*G01R 33/56* (2006.01)
*G06N 20/00* (2019.01)
*G01R 33/48* (2006.01)
*G01R 33/561* (2006.01)

(52) U.S. Cl.
CPC ..... *G01R 33/5608* (2013.01); *G01R 33/4818* (2013.01); *G01R 33/5611* (2013.01); *G06N 20/00* (2019.01)

(58) Field of Classification Search
CPC ............ G01R 33/5608; G01R 33/4818; G01R 33/5611; G01R 33/4824; G01R 33/50; G01R 33/561; G06N 20/00; G06N 3/0472; G06N 3/0454; G06N 3/08
See application file for complete search history.

(56) References Cited

U.S. PATENT DOCUMENTS

| 2015/0302579 A1 | 10/2015 | Griswold et al. |
| 2019/0101605 A1 | 4/2019 | Hyun et al. |
| 2020/0050965 A1* | 2/2020 | Harvill ..................... G06N 5/04 |

OTHER PUBLICATIONS

J. Asslander, et al., "Low Rank Alternating Direction Method of Multipliers Reconstruction for MR Fingerprinting", Magn Reson Med., 79 (1), Jan. 2018, 30 pages.

(Continued)

*Primary Examiner* — Gregory H Curran
(74) *Attorney, Agent, or Firm* — Oblon, McClelland, Maier & Neustadt, L.L.P.

(57) ABSTRACT

According to one embodiment, a medical data processing apparatus includes processing circuitry. The processing circuitry acquires first data pieces obtained by sparse sampling. The processing circuitry generates first compressed data pieces lower in number than the first data pieces by multiplying the first data pieces by each of sets of weight coefficients and adding each of the multiplied first data pieces. The processing circuitry performs first processing of outputting second compressed data pieces by applying a trained model to the first compressed data pieces, the trained model being trained by receiving first compressed data pieces based on sparse sampling and outputting at least one of second compressed data pieces based on full sampling.

19 Claims, 26 Drawing Sheets

(56) References Cited

OTHER PUBLICATIONS

Z. Fang, et al., "Deep Learning for Fast and Spatially-Constrained Tissue Quantification from Highly-Undersampled Data in Magnetic Resonance Fingerprinting (MRF)", Machine Learning in Medical Imaging (MLMI) 2018, Lecture Notes in Computer Science (LNCS), vol. 11046, Sep. 2018, 8 pages.

Y. Han, et al., "k-Space Deep Learning for Accelerated MRI", arXiv: 1805.03779v3 [cs.CV], Jul. 2019, 16 pages (with supplementary material).

* cited by examiner

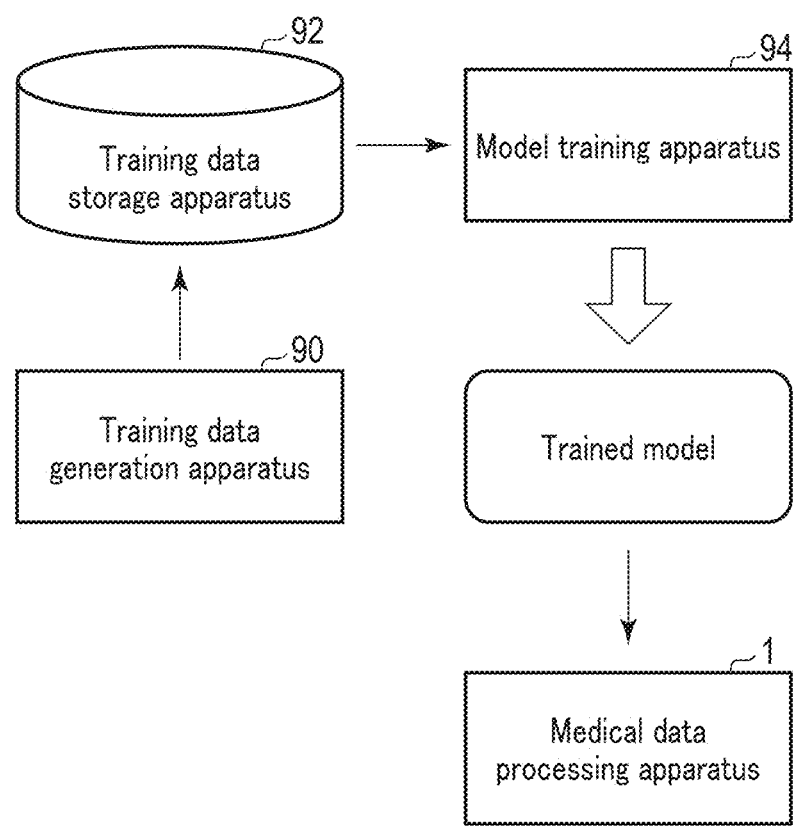
F I G. 9

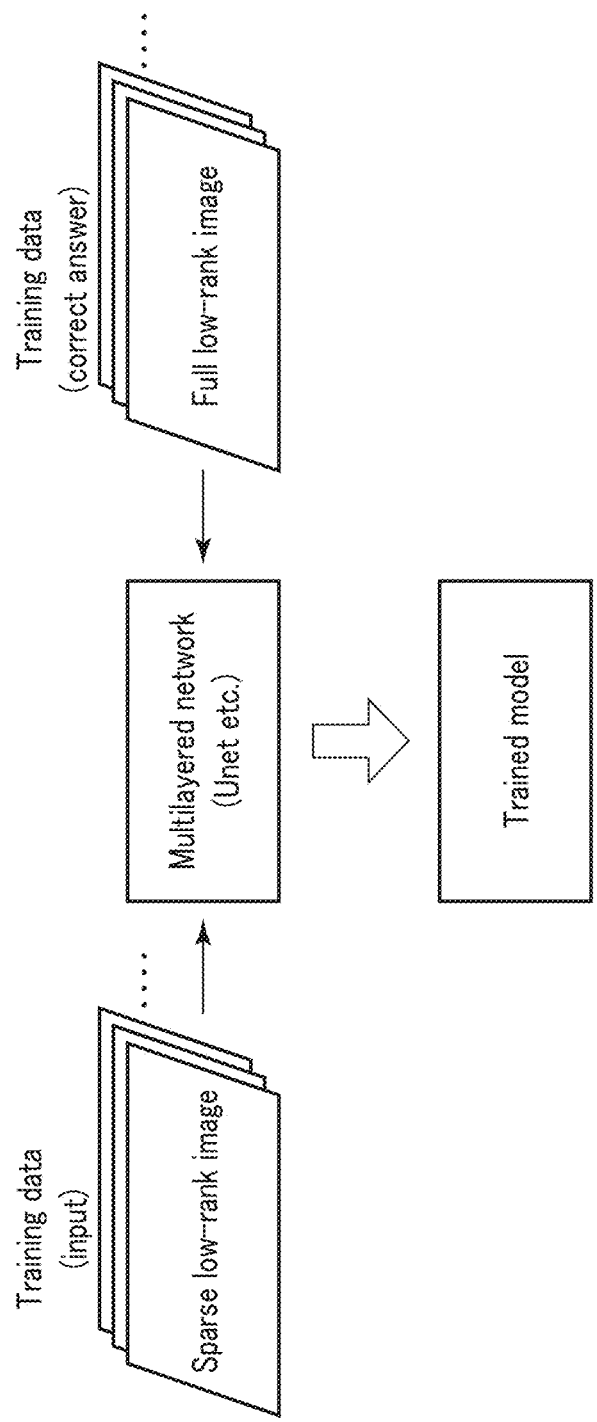
F I G. 10

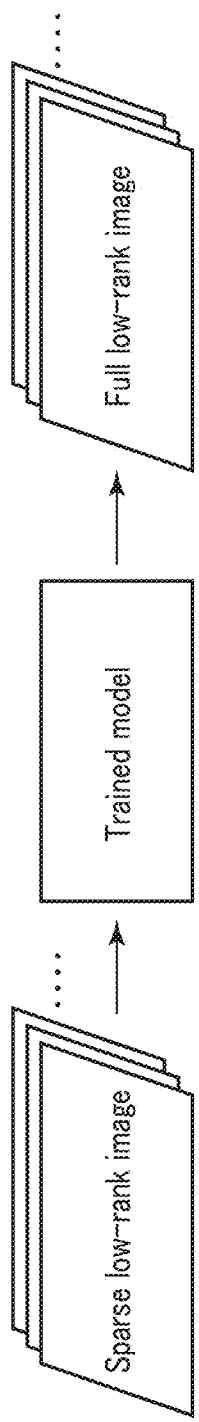
F I G. 11

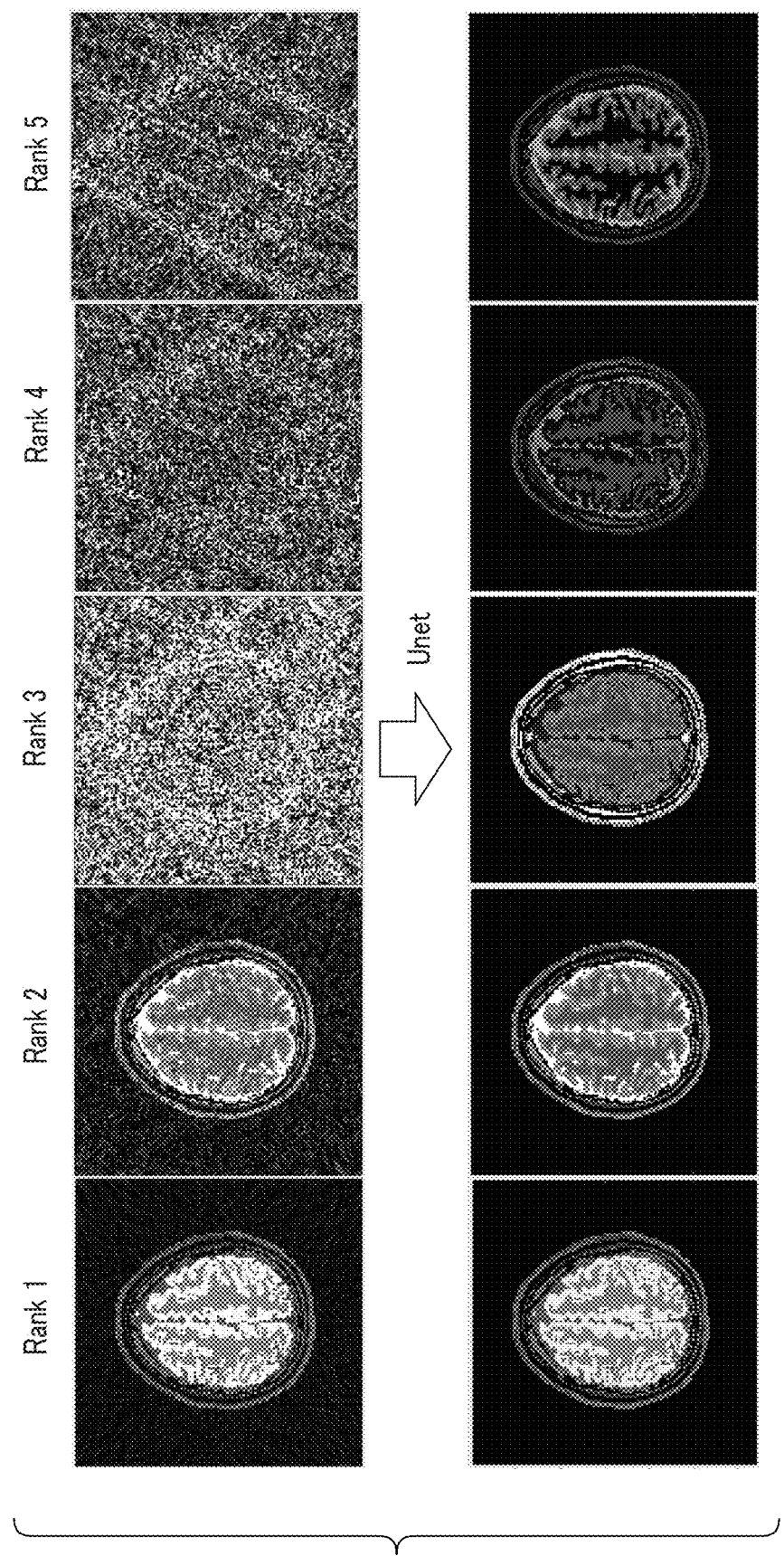
F I G. 12

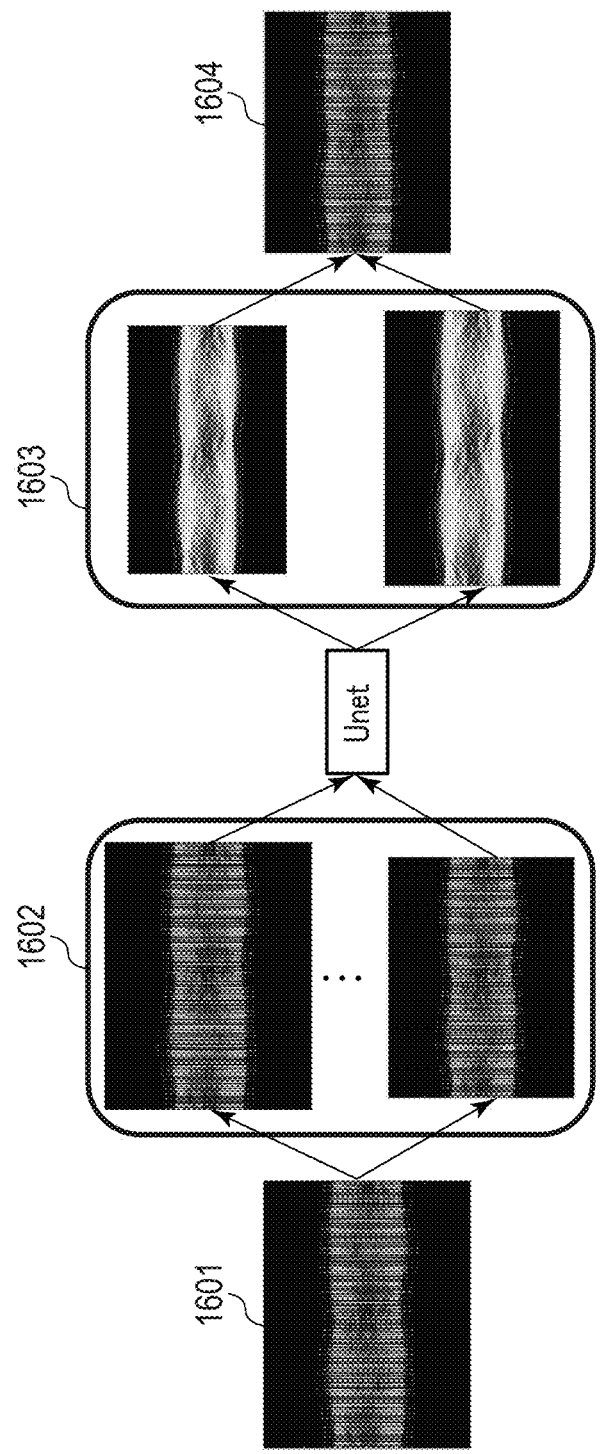
F I G. 16

MEDICAL DATA PROCESSING APPARATUS, MEDICAL DATA PROCESSING METHOD, AND MAGNETIC RESONANCE IMAGING APPARATUS

CROSS-REFERENCE TO RELATED APPLICATIONS

This application is based upon and claims the benefit of priority from the prior Japanese Patent Application No. 2019-124695, filed Jul. 3, 2019, the entire contents of which are incorporated herein by reference.

FIELD

Embodiments described herein relate generally to a medical data processing apparatus, a medical data processing method, and a magnetic resonance imaging apparatus.

BACKGROUND

In recent years, for example, magnetic resonance fingerprinting (MRF) has been proposed, in which a series of imaging is performed while changing a time of repetition (TR), an echo time (TE), and a flip angle (FA), and parameters, such as a T1 value and a T2 value, are estimated by dictionary matching. To reduce the time of dictionary matching, a method for compactifying the dictionary is known, in which an image generated from a signal value for each radio frequency (RF) transmission (also referred to as one shot) is not directly used as a dictionary but a small number of images are integrated by singular value decomposition (SVD) or principal component analysis (PCA).

However, since the dictionary matching needs to be repeated to improve the analysis accuracy, it is difficult to estimate a parameter in a short period of time.

Therefore, a method of using deep learning has also been proposed. In the deep learning, a T1 value and a T2 value are directly estimated from signal values. To check the reliability of the estimated values, such as the T1 value and the T2 value, large-scale simulation needs to be performed. If calculations are repeated to improve the reliability, the cost and time for computation will inevitably increase.

A similar problem occurs not only in the example of MRF mentioned above, but also in the case where there is a series of sparse sampling data, and a quantitative value (or a parameter value) is obtained from a change in a numerical value of the data. In such a case, the following problem occurs: since many pieces of sparse sampling data have similarities, when the pieces of sampling data can be compressed to a small amount of data, if a small amount of sparse sampling data is input and a quantitative value (or a parameter value) is output, data consistency is not necessarily ensured by the estimation using the deep learning.

BRIEF DESCRIPTION OF THE DRAWINGS

FIG. 9 is a block diagram showing an example of a system configured to generate a trained model used in the embodiment.

FIG. 10 is a diagram showing a concept of training phase of the trained model according to the first embodiment.

FIG. 11 is a diagram showing a concept of utilization phase of the trained model according to the first embodiment.

FIG. 12 is a drawing showing a first output example of the medical data processing apparatus according to the first embodiment.

FIG. 16 is a conceptual diagram showing data processing of the medical data processing apparatus according to the second embodiment.

DETAILED DESCRIPTION

Figure 1:
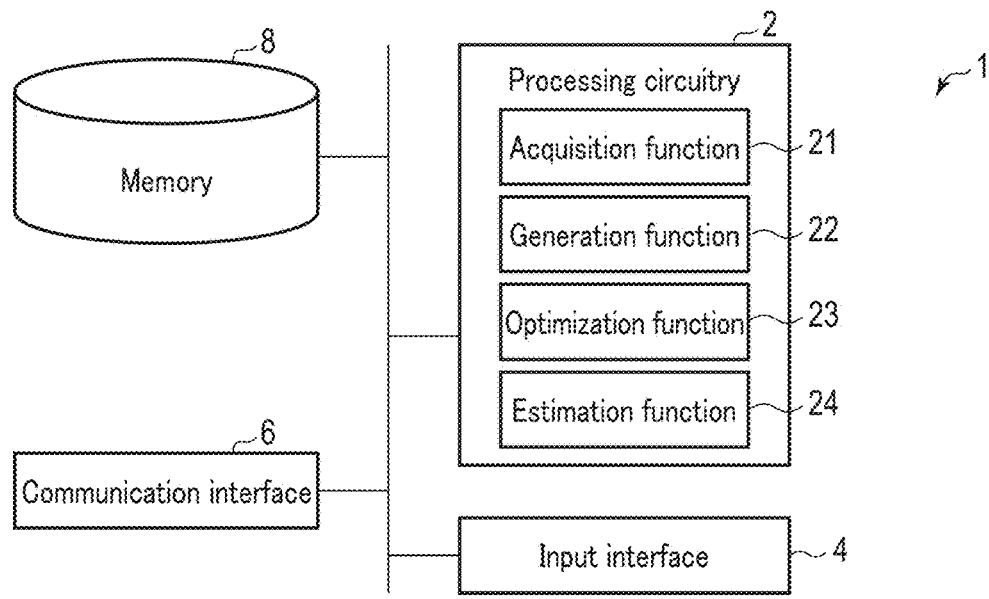
FIG. 1 is a block diagram showing a configuration of a medical data processing apparatus according to a first embodiment.

In general, according to one embodiment, a medical data processing apparatus includes processing circuitry.

The processing circuitry acquires a plurality of first data pieces obtained by sparse sampling. The processing circuitry generates a plurality of first compressed data pieces lower in number than the plurality of first data pieces by multiplying the plurality of first data pieces by each of sets of weight coefficients and adding each of the multiplied first data pieces, the number of sets of weight coefficients being smaller than the number of the first data pieces. The processing circuitry performs first processing of outputting one or more second compressed data pieces by applying a trained model to the first compressed data pieces, the trained model being trained by receiving first compressed data pieces generated from first data pieces obtained by sparse sampling for an observation target and outputting at least one of plurality of second compressed data pieces generated from a plurality of second data pieces obtained by full sampling for the observation target.

Hereinafter, a medical data processing apparatus, a medical data processing method, a medical data processing program, and a magnetic resonance imaging apparatus according to the embodiments will be described with reference to the accompanying drawings. In the embodiments described below, elements assigned with the same reference symbols are assumed to perform the same operations, and redundant descriptions thereof will be omitted as appropriate.

First Embodiment

A medical data processing apparatus according to the first embodiment will be explained with reference to the block diagram of FIG. 1.

The medical data processing apparatus 1 includes processing circuitry 2, an input interface 4, a communication interface 6, and a memory 8.

The processing circuitry 2 includes an acquisition function 21, a generation function 22, an optimization function 23, and an estimation function 24. The processing circuitry 2 includes an unillustrated processor as a hardware resource.

The acquisition function 21 acquires N pieces of first data generated by sparse sampling of a target. N is an integer of 2 or more. In this embodiment, the sparse sampling means a sampling with an interval longer than the interval at which sampling is to be usually performed, a sampling with a smaller number of samples than the number that should be usually acquired, or a sampling with a smaller number of samples that satisfy the Nyquist condition.

The generation function 22 uses M sets of N weight coefficients, and multiplies N pieces of first data by the corresponding weight coefficient and adds the products in each set, thereby compressing the N pieces of first data and generating M pieces of first compressed data. Furthermore, the first compressed data may be subjected to additional signal processing, such as Fourier transform, inverse Fourier transform, and gridding.

The M pieces of first compressed data are input to the optimization function 23. The optimization function 23 performs processing at least partially using a trained model trained to output at least one of M pieces of second compressed data obtained by compressing N pieces of second data generated by full sampling of an imaging target in the same manner as in the case of the first data, and outputs the M pieces of second compressed data from the M pieces of first compressed data.

In this embodiment, full sampling means a sampling with the interval at which sampling is to be usually performed, a sampling with the number of samples that should be usually acquired, or a sampling with the number of samples that satisfy the Nyquist condition.

The estimation function 24 performs signal processing for the M pieces of second compressed data, and estimates a desired quantitative value (or a desired parameter value), for example, a T1 value, a T2 value, or a PD value.

The estimation function 24 may generate image data (e.g., a T1 weighted image, a T2 weighted image) based on the second compressed data.

In the following explanations, each of the data used in the embodiments, the first data, the second data, the first compressed data, and the second compressed data described above, and k-space data and sinogram k-space data described in the following embodiments, is assumed to be data expressed by a matrix. However, the data is not necessarily expressed by a matrix, but may be expressed by a multi-dimensional array, such as a tensor.

The input interface 4 includes circuitry that receives various types of instructions and information input by the user. The input interface 4 includes circuitry relating to, for example, a pointing device such as a mouse, or an input device such as a keyboard. The circuitry of the input interface 4 is not limited to circuitry relating to a physical operational component, such as a mouse or a keyboard. For example, the input interface 4 may include electrical signal processing circuitry which receives an electrical signal corresponding to an input operation from an external input device provided separately from a magnetic resonance imaging apparatus 100 and outputs the received electrical signal to various circuitry.

The communication interface 6 executes data exchange with an external device by wired or wireless connections.

The memory 8 stores at least a weight coefficient, a trained model, and an estimated value. The memory 8 is, for example, a semiconductor memory element, such as a random access memory (RAM) and a flash memory, a hard disk drive (HDD), a solid state drive (SSD), or an optical disk. The memory 8 may be a drive or the like configured to read/write various types of information from/in a portable storage medium, such as a CD-ROM drive, a DVD drive, or a flash memory.

The various functions in the processing circuitry 2 are stored in the memory 8 in a form of programs executable by a computer. The processing circuitry 2 is a processor that reads programs corresponding to the various functions from the memory 8 and executes them to realize the functions corresponding to the programs. In other words, the processing circuitry 2 that has read the programs has, for example, the functions of the processing circuitry 2 shown in FIG. 1.

FIG. 1 illustrates that the aforementioned functions are implemented by the single processing circuitry 2; however, the processing circuitry 2 may be configured of a combination of a plurality of independent processors, and the functions may be implemented by the processors executing the respective programs. In other words, each of the aforementioned functions may be configured as a program, and single processing circuitry may execute each program, or each of the functions may be implemented in independent program-execution circuitry specific to the function.

In the embodiment described below, for example, magnetic resonance (MR) characteristic parameters, such as a T1 value and a T2 value, are estimated by using MR signals collected by an MR apparatus as first data obtained by sparse sampling.

In a case of obtaining a parameter value, not limited to the T1 value and the T2 value, from a change in numerical values of N pieces of sparse sampling data, such as images based on large scale data or moving pictures, even if the change in numerical values can be simulated from the parameter value and the data can be compressed to a small number of (less than N) pieces of data through processing similar to that described above because the data have similarities, the data can be processed by the medical data processing apparatus 1 of the present embodiment.

The operation of the medical data processing apparatus according to the first embodiment will be explained with reference to the flowchart of FIG. 2.

In step S201, through the acquisition function 21, the processing circuitry 2 acquires an MR signal by an imaging sequence to perform predetermined sparse sampling (hereinafter referred to as sparse sampling imaging sequence). At this time, k-space is filled with the MR signal and N pieces of integrated k-space data are acquired. N is an integer of 2 or more. The N pieces of integrated k-space data correspond to N pieces of first data. In the following, the N pieces of integrated k-space data may be referred to as a k-space data set.

In step S202, through the generation function 22, the processing circuitry 2 generates M compressed images using the acquired N pieces of integrated k-space data. Specifically, for each of the acquired N pieces of integrated k-space data, M sets of N weight coefficients, which are preset, are used. For each of the sets, the corresponding k-space data and weight coefficient are multiplied and added, so that M pieces of compressed k-space data are generated. The inverse Fourier transform is performed for the generated M pieces of compressed k-space data, thereby generating a set of M sparse compressed images. A sparse compressed image represents a compressed image generated from the k-space data obtained through the sparse sampling imaging sequence. The M sparse compressed images correspond to the M pieces of first compressed data.

The M sets of N preset weight coefficients used for the weighting of k-space data are prepared as a look-up table, in which an imaging sequence is associated with a weight coefficient for each kind of imaging sequence and scanning, for example. The weight coefficients may be acquired as weight coefficients corresponding to the imaging sequence used in step S201.

In a case of performing a full sampling imaging sequence corresponding to the sparse sampling imaging sequence performed in step S201, the N pieces of k-space data can be transformed to N full sampling real-space images by individually performing the inverse Fourier transform. In that case, with regard to a target image having a T1 value and a T2 value, it is possible to calculate, by Bloch simulation, how a real-space signal value (corresponding to a brightness of the image) of the target image changes in the N images. Specifically, if the N real-space images are numbered as t1, t2, . . . and tN, how the real-space signal values in the images t1, t2, . . . and tN should change can be calculated in advance. This change is hereinafter referred to as the real-space signal change. The real-space signal changes vary depending on the T1 value and the T2 value, and these can be associated with each other. Thus, the correspondence between each of the T1 value and the T2 value and the change in real-space signal can be prepared as a table by calculation in advance. The table is hereinafter referred to as a dictionary.

At this time, the weight coefficients generated based on the dictionary as described below can be used. For example, with regard to the matrix acquired by extracting and putting all sets of the real-space signal changes in order, the M sets selected in descending order from the weight coefficients obtained by singular value decomposition can be used as the weight coefficients. In this case, the M compressed images are low-rank approximated to a rank M generated by using N pieces of k-space data. Details of this matter will be described later with reference to FIGS. 7 and 8. In this method, the dictionary is used only to obtain weight coefficients.

In the following, for example, since the value obtained by singular value decomposition is used as the weight coefficient, the sparse compressed image is referred to as a sparse low-rank image. Furthermore, the M sparse low-rank images may be collectively referred to as a sparse low-rank image set.

In step S203, the processing circuitry 2 applies the trained model to the M sparse low-rank images, and outputs M full low-rank images. The M full low-rank images correspond to the M pieces of second compressed data.

The M full low-rank images are the M images acquired through processing of the N pieces of k-space data acquired by the full sampling imaging sequence corresponding to the sparse sampling imaging sequence used in step S201 in the same manner as in the case of acquiring the sparse low-rank images. Later, explanations will be given with reference to FIG. 6. The M full low-rank images may be collectively referred to as a full low-rank image set.

Preferably, the number M (rank M) of sets of full low-rank images as an output is equal to the number M (rank M) of sets of sparse low-rank images as an input. However, if the number of ranks of the input is greater than the number of ranks of the output, the output accuracy can be improved. If the number of ranks of the input is smaller than the number of ranks of the output, the output accuracy may be slightly lowered while the memory capacity and the calculation speed can be increased. Thus, the number of input ranks and the number of output ranks can be adjusted as appropriate in accordance with the purpose of use. Therefore, in step S203 described above, the M full low-rank images to be output may be limited to, for example, a desired rank, and it is preferable that at least one rank be output. That is, the embodiment is not limited to the case of outputting all of the M full low-rank images. In the embodiment described below, the number of input ranks and the number of output ranks are equal.

In step S204, through the optimization function 23, the processing circuitry 2 checks data consistency between the full low-rank image set acquired by applying the trained model and the k-space data set acquired in step S201, and determines whether the convergence condition in consideration of the data consistency is satisfied.

Specifically, the processing circuitry 2 inverse-transforms the acquired full low-rank image set, generates a k-space data set for checking, which is a k-space data set for consistency checking obtained by sparse sampling, and determines whether or not a value of an error function including an evaluation of a difference between the checking k-space data set and the k-space data set acquired in step S201 is equal to or smaller than a threshold value. If the value of the error function is equal to or smaller than the threshold value, the processing proceeds to step S206. If the value of the error function is greater than the threshold value, the processing circuitry 2 determines that the convergence condition is not satisfied and proceeds to step S205.

In step S205, through the optimization function 23, the processing circuitry 2 newly generates a corrected full low-rank image set to correct the sparse low-rank image set to which the trained model is applied, and generates a sparse low-rank image set corresponding thereto. Thereafter, the processing returns to step S203, and the same processing is repeated; that is, the processing from step S203 to step S205 is repeated until the convergence condition is satisfied.

In step S206, through the estimation function 24, the processing circuitry 2 estimates, from the generated full low-rank image set, various quantitative values that are estimable from the used imaging sequence. For example, the processing circuitry 2 calculates the T1 value, the T2 value, and the photon density (PD) value. As a method for calculating the T1 value, the T2 value, and the PD value from the full low-rank image set, for example, dictionary matching may be performed, or analytical fitting may be performed. Alternatively, the values may be calculated by applying a trained model generated through machine learning, such as deep learning.

Through the estimation function 24, the processing circuitry 2 may directly generate a T1 weighted image and a T2 weighted image without calculating the T1 value and the T2 value. In this case, the processing circuitry 2 may use a trained model that can transform the full low-rank image set directly to the T1 weighted image and T2 weighted image.

Alternatively, the full low-rank image set generated in step S203 may be output. Furthermore, if the value of the error function is greater than the set value in step S204, an alert may be output.

Figure 2:
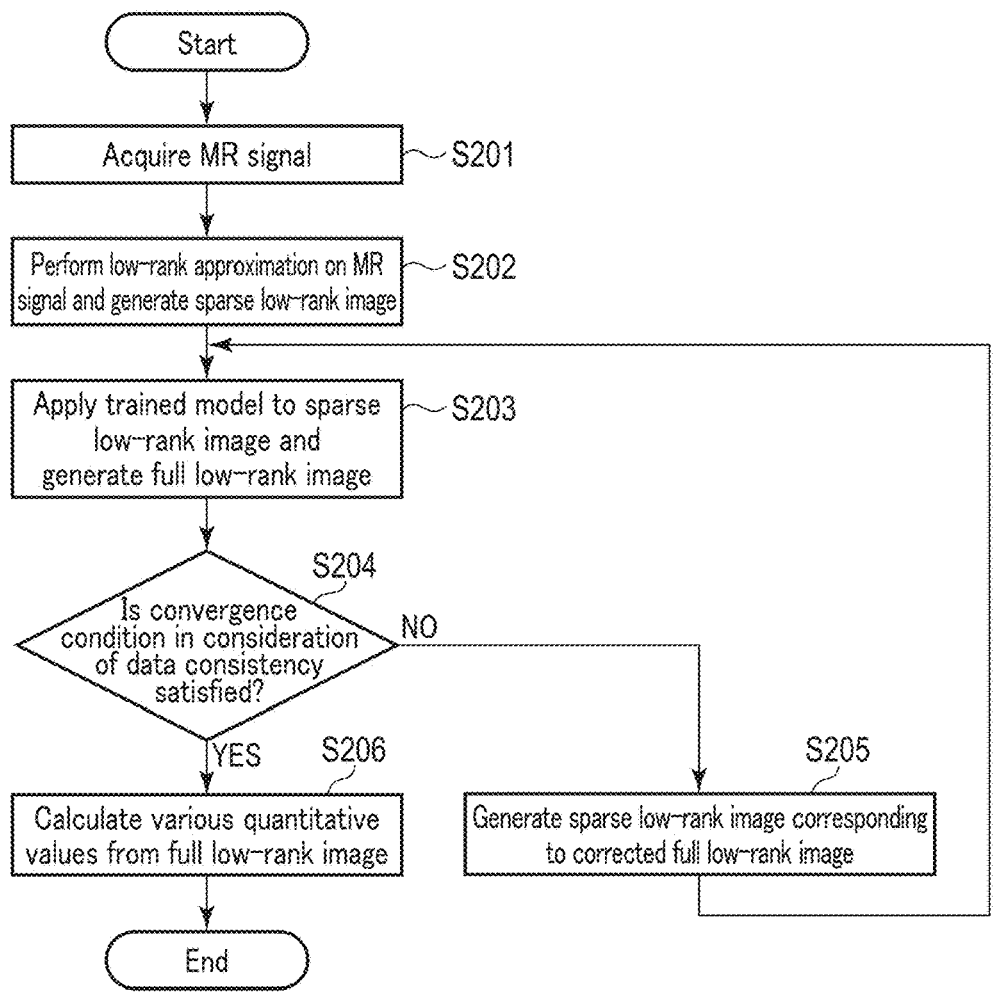
FIG. 2 is a flowchart showing an operation of the medical data processing apparatus according to the first embodiment.

In the example shown in FIG. 2, the convergence condition is whether or not the value of the error function including the evaluation of the difference between the checking k-space data set and the acquired k-space data set is equal to or smaller than the threshold value. However, the number of repetition times may be used as the convergence condition.

The operation example of the medical data processing apparatus using the number of repetition times as the convergence condition according to the first embodiment will be explained with reference to the flowchart of FIG. 3. The processing of step S201 to step S203, step S205, and step S206 are the same as that shown in FIG. 2.

In step S301, a flag of the number of processing times is initialized. For example, the flag of the number of processing times is set to 0.

In step S302, it is determined whether or not the number of times of applying the trained model is equal to or greater than a threshold value. In other words, it is determined whether or not the number of times of generating the full low-rank image set from the sparse low-rank image set using the trained model is equal to or greater than the threshold value. If the number of times of applying the trained model is less than the threshold value, the processing proceeds to step S205. If the number of times of applying the trained model is equal to or greater than the threshold value, the processing proceeds to step S206.

In step S303, the flag of the number of processing times is incremented by 1, and the processing returns to step S203. Similar processing is repeated.

The flag of the number of processing times may be set to 1. That is, the processing of step S302 is not repeated but executed only once, and the full low-rank image set may be directly output.

The value of the error function may be calculated when the repetition is completed, and if the value exceeds the set value, an alert may be output.

Figure 3:
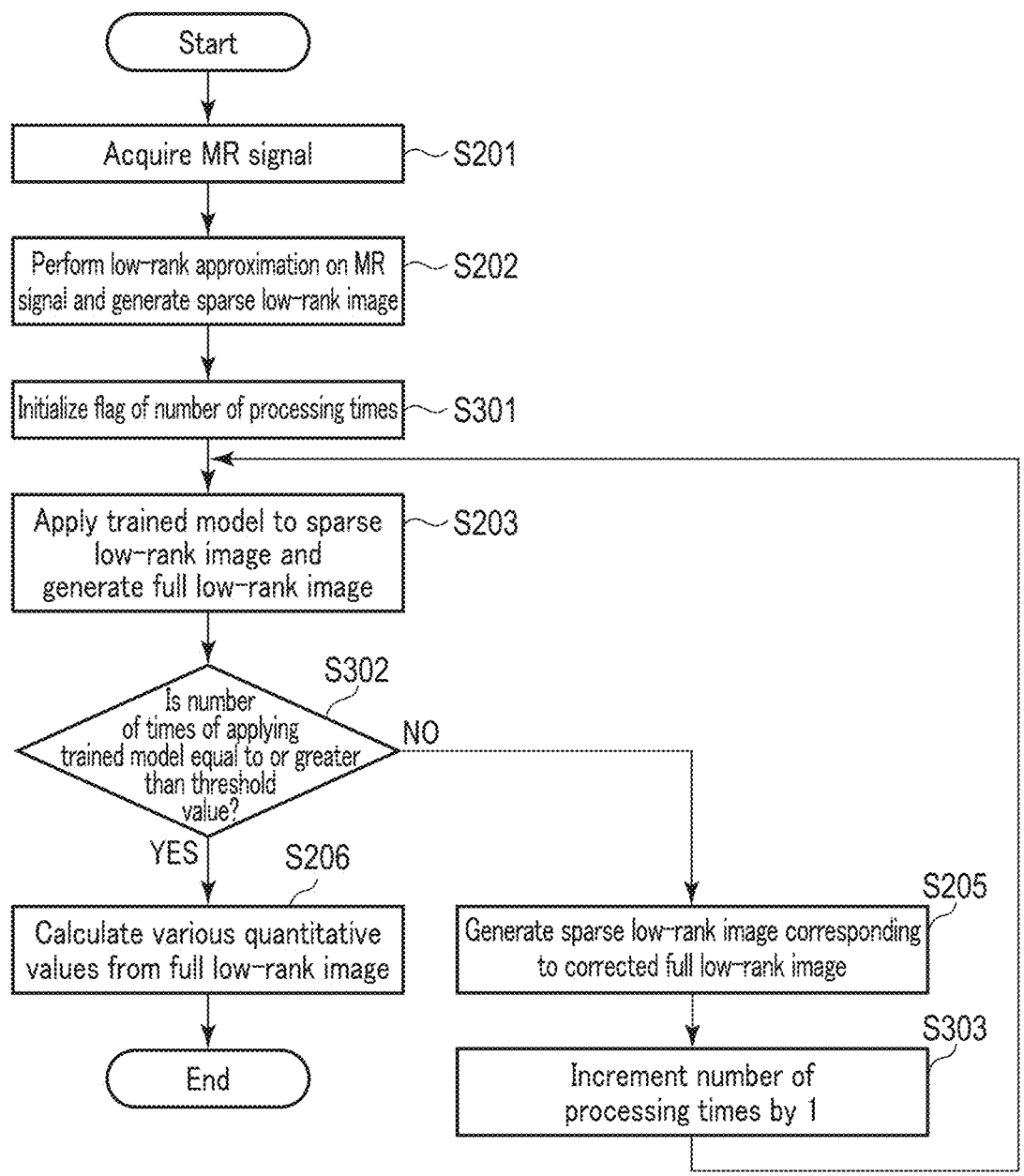
FIG. 3 is a flowchart showing an operation of the medical data processing apparatus according to the first embodiment using the number of repetition times as a convergence condition.

The determination processing with the value of the error function and the threshold value shown in FIG. 2 may be combined with the determination processing relating to the number of times of applying the trained model shown in FIG. 3. If either determination processing satisfies the convergence condition, the full low-rank image set may be output or the processing may proceed to step S206.

An example of the imaging sequence according to the first embodiment will now be explained with reference to FIG. 4.

Figure 4:
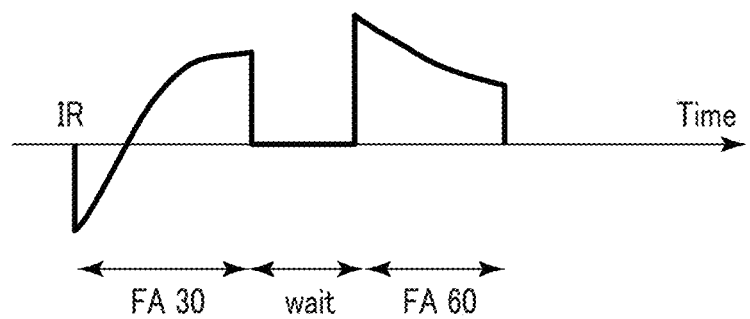
FIG. 4 is a diagram showing an example of an imaging sequence according to the first embodiment.

FIG. 4 shows an imaging sequence of inversion recovery-balanced steady-state free precession (IR-bSSFP). In FIG. 4, the horizontal axis represents time, and the vertical axis schematically represents a k-space MR signal value or a real-space signal value. In the first embodiment, two-dimensional (2D) radial scanning is performed by IR-bSSFP. It is assumed that one spoke is scanned by one shot, and the echo time (TE) and the time of repetition (TR) are respectively fixed to 2.5 ms and 5 ms. First, an IR pulse (180° pulse) is transmitted. Subsequently, imaging at a flip angle (FA) of 30° is performed 400 times (400 shots). After two seconds of waiting time, imaging at a flip angle (FA) of 60° is performed 400 times (400 shots). This is a general imaging sequence, in which the flip angle varies before and after the waiting time. In data analysis, data are integrated for each shot into one piece, so that 800 pieces of integrated k-space data are obtained. In this case, N is 800.

The imaging sequence is not limited to IR-bSSFP, but may be any other sequence, such as fast imaging with steady-state precession (IR-FISP).

The scanning method is not limited to the radial scanning, but may be any other scanning, such as propeller scanning or spiral scanning.

Next, an example of the radial scanning assumed in the present embodiment will be explained with reference to FIG. 5.

Figure 5:
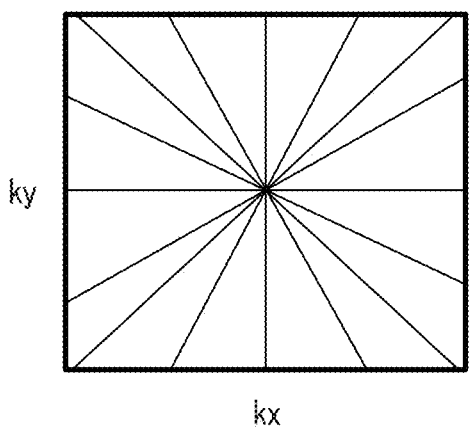
FIG. 5 is a diagram showing an example of a radial scan assumed in the first embodiment.

FIG. 5 shows a trajectory of radial scanning in k-space with a horizontal axis kx, and a vertical axis ky. In this embodiment, as shown in FIG. 5, the angle of a spoke of the radial scanning is increased (rotated) by a golden angle ($2\pi/(1+\sqrt{5})$) for each shot. However, this is a mere example. The increase of the spoke angle is not necessarily set to the golden angle.

At this time, the dictionary can be created by performing the Bloch simulation of full sampling imaging (to be described later with reference to FIG. 6) corresponding to the imaging sequence, thereby obtaining a real-space signal change corresponding to the T1 value and the T2 value. The dictionary is created as the relationship between a change of the signal value, and the T1 value and T2 value. Alternatively, the dictionary may be created directly from a real-space signal change obtained by the Bloch simulation in real space as the relationship with the T1 value and T2 value.

The created dictionary is subjected to dimensional compression including a multivariate analysis, such as the singular value decomposition (SVD) or principal component analysis (PCA), and a nonnegative matric factorization (NMF). As a result, M sets of weight coefficients to perform low-rank approximation can be obtained. The process for dimensional compression may be performed by a general method. For example, in the case of using the SVD, the number of dimensions (rank) can be compressed to M by selecting the M sets of weight coefficients in descending order of the singular values. In this case, the number M of full low-rank images 602 corresponds to the number of ranks. This number may be one that corresponds to the accuracy of reproducibility of an image to be required in post processing. In this embodiment, M is 5. That is, the processing corresponds to the compression from N=800 to M=5.

Next, a concept of the full low-rank image and an example of generation thereof will be described in detail with reference to FIG. 6. The full low-rank images are M low-rank images generated by performing the inverse Fourier transform for M pieces of low-rank k-space data. The M pieces of low-rank k-space data are generated by multiplying N pieces of k-space data that are imaging all spokes necessary to full sampling imaging at each imaging time (t1, t2, t3, . . . ) by the weight coefficient obtained by the SVD as described above at each imaging time (t1, t2, t3, . . . ) and adding the products. If the full low-rank image set is obtained, the full sampling image at each shot can be obtained as an approximate image through the reverse processing. Thus, the T1 value, the T2 value, or the like can be obtained with high accuracy.

More specifically, a set of weight coefficients 603 to be multiplied by the respective shots are calculated by low-rank approximating the dictionary to the rank M by the SVD or the like. M pieces of full sampling low-rank k-space data 604 are generated by multiplying the N pieces of k-space data full-sampled at the respective shots by the N weight coefficients 603 and adding the products (i.e., sum of the multiplied N pieces of k-space data). The M pieces of full sampling low-rank k-space data 604 are each subjected to the inverse Fourier transform, thereby generating M pieces of full low-rank images 602.

A full sampling k-space signal can be generated by imaging simulation of a numerical phantom. It can also be generated by repeatedly imaging as described above with reference to FIG. 4 and FIG. 5 (to be described in detail later with reference to FIG. 7) a plurality of times and integrating the images into one, while increasing the initial spoke angle by the golden angle. Thus, when full sampling imaging is performed, the sparse sampling imaging is performed a number of times corresponding to the number of spokes necessary for the full sampling, while changing the initial value of the spoke angle by the golden angle. Accordingly, the full sampling k-space signal can be obtained by integrating all the data for the respective imaging times. In the case of using another imaging sequence or imaging trajectory, imaging is performed a plurality of times, which is necessary for full sampling and all k-space data are integrated for the respective imaging times through similar processing, so that the N pieces of full sampling k-space data can be obtained.

A concept of the sparse low-rank image obtained by one sparse sampling imaging described above with reference to FIG. 4 and FIG. 5 and an example of generation thereof will now be described in detail with reference to FIG. 7.

Figure 6:
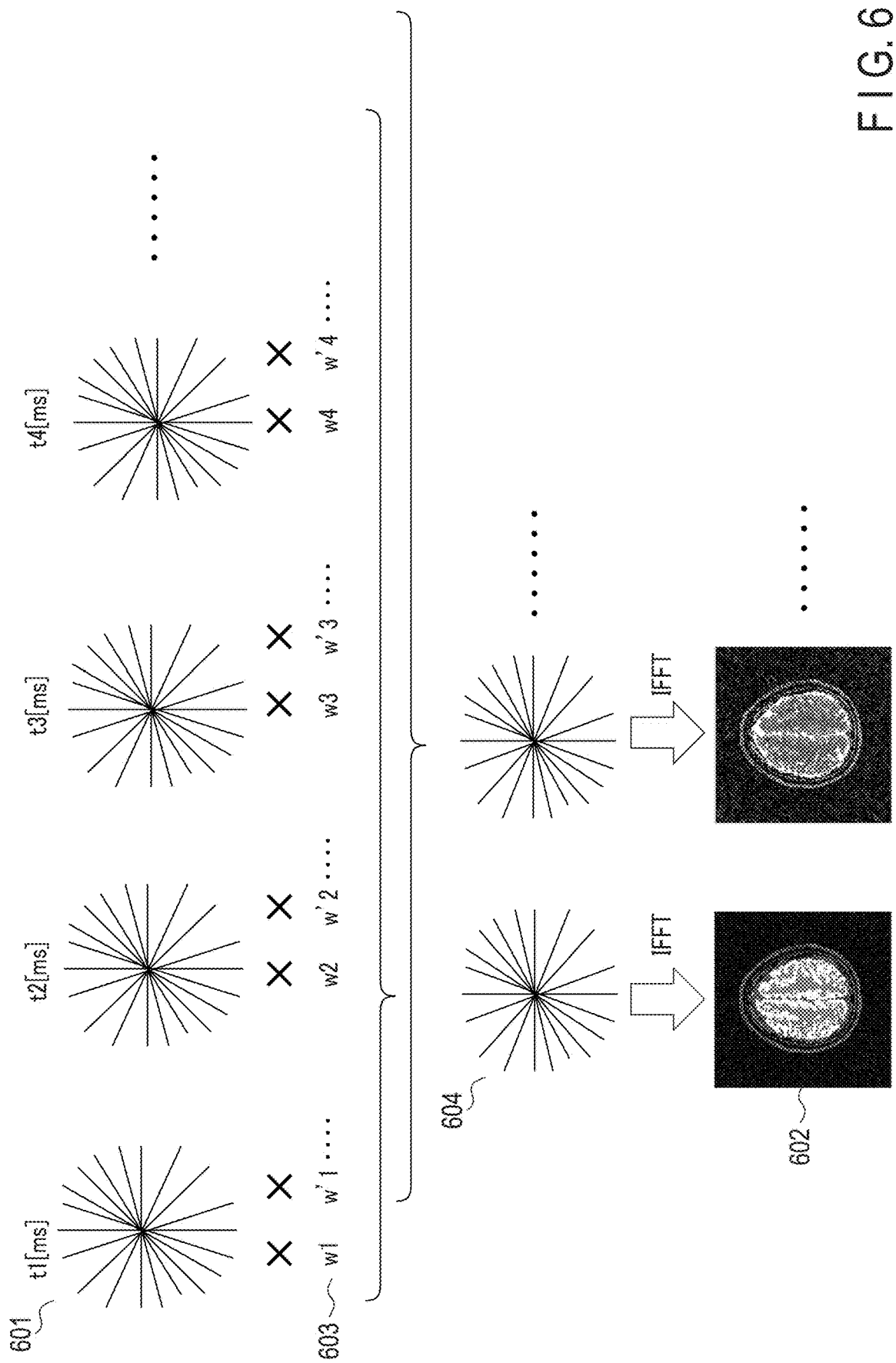
FIG. 6 is a diagram showing a concept and an example of generation of a full low-rank image.
Figure 7:
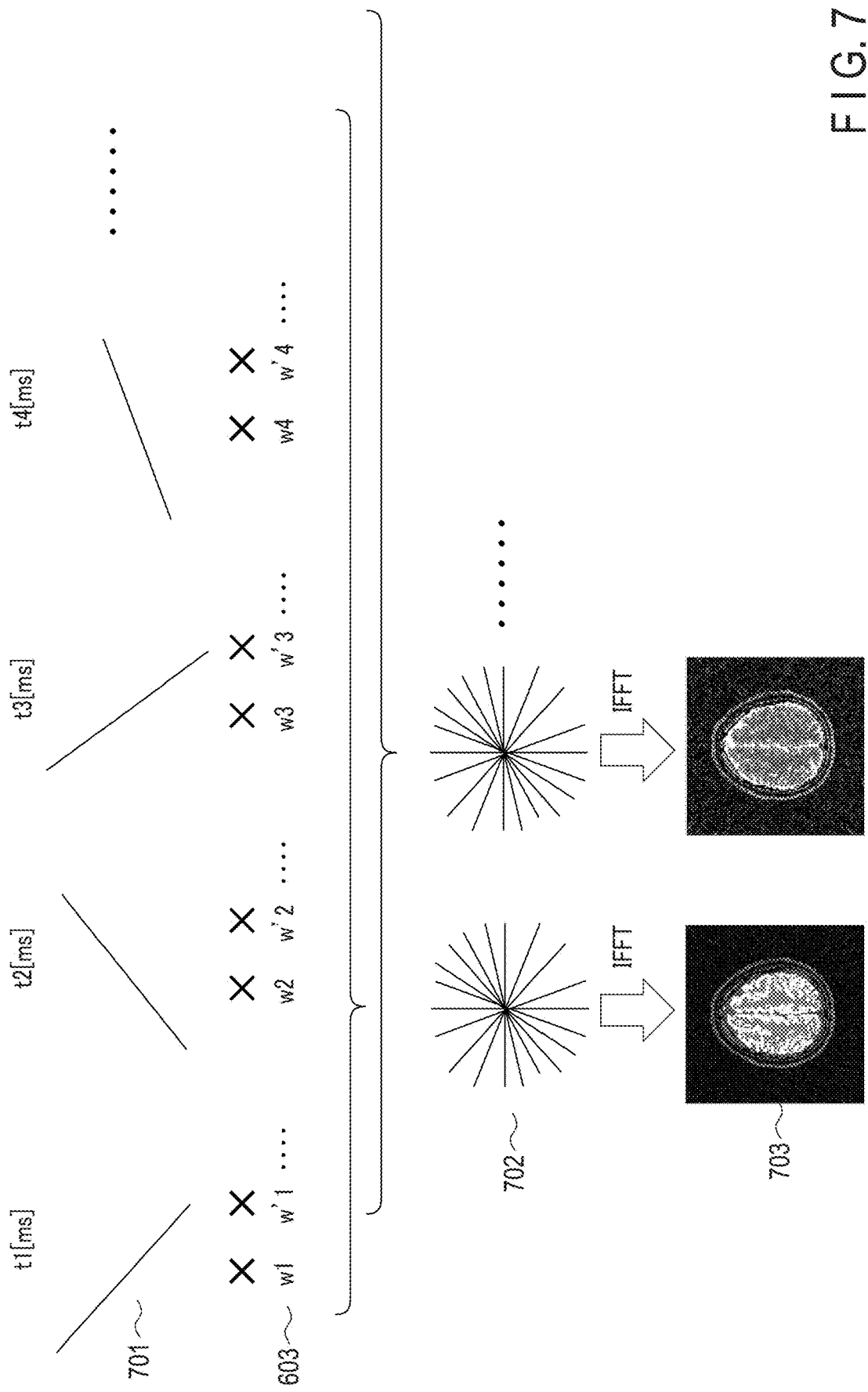
FIG. 7 is a diagram showing a concept and an example of generation of a sparse low-rank image.

FIG. 7 shows an example in which the same radial scanning as shown in FIG. 6 is assumed. Unlike the full sampling shown in FIG. 6, an MR signal along the trajectory of one spoke in radial scanning is collected for each shot. A k-space is filled with the MR signal, thereby acquiring k-space data. Specifically, an MR signal along a spoke inclined downward and to the right is collected at imaging time t1, and an MR signal along a spoke inclined upward and o the right is collected at imaging time t2. Thus, sparse-sampled k-space data 701 is acquired at each imaging time.

M pieces of sparse sampling low-rank k-space data 702 are generated by multiplying the sparse sampling k-space data 701 at the respective imaging times by the M sets of weight coefficients and adding the products. Furthermore, the M pieces of sparse sampling low-rank k-space data 702 are each subjected to the inverse Fourier transform, thereby generating M pieces of sparse low-rank images 703. The M sets of N weight coefficients 603 to be multiplied by the N pieces of sparse sampling k-space data 701 are basically the same as the weight coefficients used when generating the full low-rank images. However, different weight coefficients may be used according to circumstances.

An example of the look-up table, in which a weight coefficient and an imaging sequence are associated, will be described with reference to FIG. 8.

Figure 8:
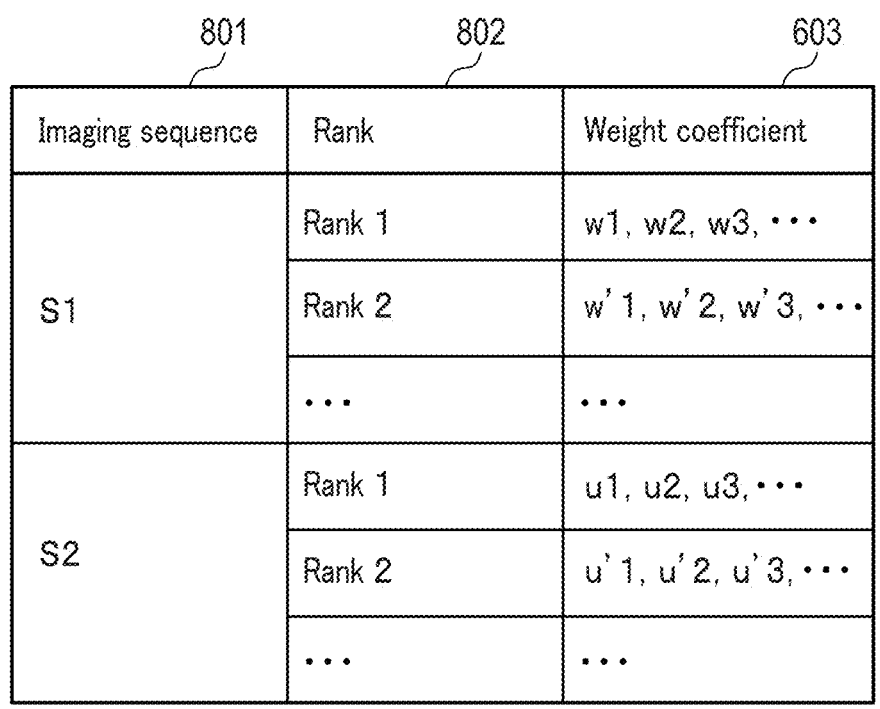
FIG. 8 is a diagram showing an example of a look-up table in which a weight coefficient is associated with an imaging sequence.

As shown in FIG. 8, a type of scanning and imaging sequence 801, and a set of a rank 802 and a weight coefficient 603 corresponding to the rank are stored in association with each other. Specifically, for example, the type of scanning and imaging sequence 801 "S1" is associated with a set of the rank 802 "rank 1" and the weight coefficient 603 "w1, w2, w3, . . . ", and a set of the rank 802 "rank 2" and the weight coefficient 603 "w'1, w'2, w'3, . . . ".

An example of a system configured to generate a trained model for use in the optimization function 23 through simulation or actual measurement data is shown in the block diagram of FIG. 9. Training may be performed by using a set of training data generated by simulation data, or a pair of actual sparse sampling image data and full sampling image data generated by integrating the sparse sampling data obtained by repeating sparse sampling imaging a plurality of times.

FIG. 9 includes a training data generation apparatus 90, a training data storage apparatus 92, a model training apparatus 94, and the medical data processing apparatus 1.

The training data generation apparatus 90 generates a pair of a full low-rank image set and a sparse low-rank image set through Bloch imaging simulation using a numerical phantom. The full low-rank image set may be generated directly from the Bloch simulation in real space instead of performing imaging simulation. The sparse low-rank image can be obtained by calculation of simulating an actual imaging sequence. In the case of radial scanning, the sparse low-rank image is generated by simulating k-space data of each spoke at each shot. The obtained k-space data at the respective shots are multiplied by the M sets of weight coefficients obtained from the SVD of the corresponding dictionary and the products are added, and subjected to the inverse Fourier transform. As a result, M sparse low-rank images can be generated.

The training data generation apparatus 90 generates M sparse low-rank images and M full low-rank images as a set of training data. The training data is preferably created for each imaging sequence, scanning method and imaging site. For example, when creating a trained model for brains, a set of M full low-rank images, which are correct answer data for each parameter condition, and M sparse low-rank images, which are input data, is generated through simulation, while the T1 value, the T2 value, the PD value and other various parameters of slice cross sections of white substance, gray substance, bone, cerebrospinal fluid, etc. are changed appropriately using a phantom, such as a head numerical phantom. Each of the low-rank images include a real image and a virtual image.

The training data storage apparatus 92 stores the training data generated by the training data generation apparatus 90. The training data storage apparatus 92 is, for example, a computer with a built-in large-capacity storage device. The training data storage apparatus 92 may be a large-capacity storage device connected to a computer via a cable or a communication network in a communicatory manner. As such a storage device, an HDD, an SSD, an integrated circuit storage device, etc. can be suitably adopted. The training data storage apparatus can store training data created by actually performing full sampling imaging and sparse sampling imaging in addition to the training data generated through simulation. Thus, it is possible to perform training using the training data generated through simulation or the training data obtained through actual imaging, or both.

The model training apparatus 94 generates a trained model by training a machine learning model based on training data stored in the training data storage apparatus 92, according to a model training program. The machine learning model in this embodiment is assumed to be a multilayered network used in deep learning, but may be any other machine learning algorithm, such as a decision tree or kernel regression, that can provide any characteristic from training data. Another model training apparatus 94 may be a computer, such as a workstation, including a general purpose processor such as a central processing unit (CPU) or a graphics processing unit (CPU), or including a processor exclusively configured for machine learning.

The model training apparatus 94 and the training data storage apparatus 92 may be communicably connected via a cable or a communication network. Alternatively, the training data storage apparatus 92 may be installed in the model training apparatus 94. In those cases, training data is supplied from the training data storage apparatus 92 to the model training apparatus 94. The model training apparatus 94 and the training data storage apparatus 92 need not be communicably connected. In such a case, the training data is supplied from the training data storage apparatus 92 to the model training apparatus 94 via a portable storage medium storing the training data thereon.

The medical data processing apparatus 1 and the model training apparatus 94 may be communicably connected via a cable or a communication network. The trained model generated in the model training apparatus 94 is supplied to the medical data processing apparatus 1, and the trained model is stored in the memory 8 of the medical data processing apparatus. The medical data processing apparatus 1 and the model training apparatus 94 may not necessarily be communicably connected. In such a case, the trained model is supplied from the model training apparatus 94 to the medical data processing apparatus 1 via a portable storage medium, etc. storing the trained model thereon.

Next, a concept of training phase for a trained model according to the first embodiment will be described with reference to FIG. 10. FIG. 10 shows a multilayered network before learning and training data to be input to the multilayered network.

When a trained model is learned, machine learning may be performed to learn the multilayered network using the training data, at the time of shipping a product, for example. It may be possible to update the trained model at the time of repair or a software update.

The multilayered network is assumed to be, for example, a multilayered neural network or a convolution neural network. However, another network configuration developed and derived from the convolution network, such as U-net, ResNet, or DenseNet, may be used as the multilayered network. The multilayered network to be learned may have another configuration of a generative adversarial network (GAN), a deep convolutional GAN (DCGAN), or Pix 2 Pix.

The training data is a data set including a plurality of pairs of a full low-rank image as correct answer data and a sparse low-rank image as input data corresponding to the full low-rank image. Through learning of the multilayered network using the data set, a trained model can be generated. The learning of the multilayered network using the training data may be general learning and detailed descriptions thereof will be omitted.

Next, a concept of utilizing a trained model according to the first embodiment will be described with reference to FIG. 11.

When the trained model is utilized, a full low-rank image set is generated by applying the trained model based on the corresponding imaging sequence and scanning method to a sparse low-rank image set. The number of images included in the full low-rank image set to be output is not necessarily the same as the number of images included in the sparse low-rank image set. At least one full low-rank image may be output by inputting the sparse low-rank image set and using the trained model. In other words, since the model has been trained to output a full low-rank image corresponding to the number of images included in the sparse low-rank image set, the number of full low-rank images to be output can be adjusted in accordance with the number of full low-rank images that will be required in post processing.

An example of low-rank approximation will now be described using formulas.

The rank of a matrix can be reduced by the SVD by using low-rank approximation. For example, low-rank approximation of a matrix δ created by arraying changes in a real space MR signal of a dictionary is expressed in the following formulas:

$$\delta = u \Sigma v^H \quad (1)$$

$$\tilde{\delta} = u_R^H \cdot \delta \quad (2)$$

The upper formula (1) expresses the SVD, and the lower formula (2) expresses the low-rank approximation. The tilde (~) represents the variable that was subjected to the low-rank approximation. $\tilde{\delta}$ represents the dictionary that was subjected to the low-rank approximation. The superscript H represents Hermitian transposition. $u_R^H$ is a matrix having R rows of singular values in descending order. Elements of the matrix are weight coefficients. Thus, the weight coefficients can be obtained from the dictionary. R is a natural number of 1 or more. Another variable can also be low-rank approximated by using the weight coefficient matrix $u_R^H$.

Next, an example of the optimization method in step S203 to step S205 will be explained, in which an alternating directional method of multipliers (ADMM) is used. In this method, the processes in step S203 to step S205 are integrated with the ADMM when executed.

First, x~ is assumed to be a matrix in which the low-rank approximated M images are integrated into one. This corresponds to a low-rank image set. Assuming that D~ is a matrix of an expected value (a normalized value that x~ is expected to have and that is obtained from the output of the trained model), the following augmented Lagrangian can be considered:

$$\arg\min_{\tilde{D},\tilde{x},\tilde{y}} \|\tilde{G} \cdot \tilde{F} \cdot \tilde{x} - S\|_2^2 + \mu \|\tilde{x} - \tilde{D} \cdot \tilde{D}^H \cdot \tilde{x} + \tilde{y}\|_2^2 \quad (3)$$

y~ is a Lagrange coefficient of the scaled dual form. μ is a penalty parameter. S is a k-space data set obtained by imaging. G is gridding of k-space corresponding to the imaging sequence. F is an operator working to transform a state by the Fourier transform corresponding to the imaging sequence. $\tilde{x}$ that satisfies this formula is a full low-rank image set to be obtained. In formula (3), the first term represents data consistency and the second term represents consistency with the expected value.

To solve formula (3) by the ADMM, the following updating formulas (4) to (6) can be used:

$$\tilde{x}_{j+1} = \arg\min_{\tilde{x}} \|\tilde{G} \cdot \tilde{F} \cdot \tilde{x} - S\|_2^2 + \mu \|\tilde{x} - \tilde{D}_j \tilde{D}_j^H \tilde{x} + \tilde{y}_j - \tilde{D}_j \tilde{D}_j^H \tilde{y}_j\|_2^2 \quad (4)$$

$$\tilde{D}_{j+1} = \arg\min_{\tilde{D}} \|\tilde{x}_{j+1} - \tilde{D}\tilde{D}^H \tilde{x}_{j+1} + \tilde{y}_j - \tilde{D}\tilde{D}^H \tilde{y}_j\|_2^2 \quad (5)$$

$$\tilde{y}_{j+1} - \tilde{D}_{j+1} \tilde{D}_{j+1}^H \tilde{y}_{j+1} = \tilde{y}_j - \tilde{D}_j \tilde{D}_j^H \tilde{y}_j + \tilde{x}_{j+1} - \tilde{D}_{j+1} \tilde{D}_{j+1}^H \tilde{x}_{j+1} \quad (6)$$

Unlike the general ADMM, in this method, the Lagrange coefficient "$\tilde{y}$" is replaced by "$\tilde{y} - \tilde{D}\tilde{D}^H\tilde{y}$". Thus, the method can also be referred to as approximated ADMM.

As an algorithm for repeat convergence, first, operators corresponding to the imaging sequence are prepared as $\tilde{G}$ and $\tilde{F}$.

In the case of solving formula (4) first, j is set to 0 and suitable initial values are substituted for $\tilde{D}_0$, $\tilde{x}_0$, and $\mu$, so that $\tilde{y}_0$ is a zero matrix.

As a first step, formula (4) is solved to obtain $\tilde{x}_1$. Formula (4) can be solved as a minimization problem using a conjugate gradient (CG) method. The residual error in this case can be used for determination of S204 as a value of an error function.

As a second step, the expected value $\tilde{D}_1$ in formula (5) is obtained by applying the trained model. Since the second step corresponds to obtaining the expected value for a full low-rank image set $(\tilde{x}_{j+1} + \tilde{y}_j)$, the expected value can be obtained by processing of generating a full low-rank image set by applying the trained model to the sparse low-rank image set obtained from $(\tilde{x}_{j+1} + \tilde{y}_j)$. This step corresponds to step S203.

The full low-rank image set obtained as an output has not been normalized, and the expected value $\tilde{D}_1$ is updated using a value obtained by normalization to make the absolute value of a signal value of each voxel become "1". Specifically, in the case of the rank "5", if the signal values of voxels in the five full low-rank images are respectively s1, s2, s3, s4, and s5, each signal value is divided by $(s1^2+s2^2+s3^2+s4^2+s5^2)^{1/2}$ to make the absolute value "1", and the obtained value can be determined as the expected value $D_1$.

As a third step, $\tilde{y}_1$ is obtained by using formula (6) $\tilde{y}_1$ may be obtained by solving formula (6) by substituting $\tilde{x}_1$ and $\tilde{D}_1$ obtained in the first and second steps into the formula to obtain an inverse matrix, or by solving the formula by numerical calculation of the CG method or the like. If the accuracy of generation of a full low-rank image set using a trained model is high, the value of $\tilde{y}_1$ is sufficiently small. Therefore, the term $(\tilde{D}_{J+1} \cdot \tilde{D}_{J+1}^H \cdot \tilde{y}_{J+1})$ may be ignored. By updating $\tilde{y}_1$ in the third step, a corrected full low-rank image set $(\tilde{x}_{j+1} + \tilde{y}_{j+1})$ is newly generated, and the corresponding sparse low-rank image set can be obtained by $\tilde{G} \cdot \tilde{F} \cdot (\tilde{x}_{j+1} + \tilde{y}_{j+1})$. This step corresponds to step S205.

Subsequently, the value of j is incremented by 1, and the processing returns to the first step. While the first to third steps are repeated, the values of $\tilde{x}_j$, $\tilde{D}_j$, and $\tilde{y}_j$ are obtained. As the convergence condition, it is possible to determine that the processing is converged if the number of repetitions reaches a threshold value, or if the value of the error function is smaller than a threshold value, using the residual error of formula (4) as the value of the error function. This step corresponds to step S204.

As another example of the optimization method in step S203 to step S204, the accuracy of the optimization can be improved by repeating the processing using the following formula (7):

$$\arg\min_{\tilde{D},\tilde{x},\tilde{y}} \|\tilde{G} \cdot \tilde{F} \cdot \tilde{x} - S\|_2^2 + \|CNN(\tilde{F}^H \cdot \tilde{G}_{dc}^H \cdot \tilde{G} \cdot \tilde{F} \cdot \tilde{x}) - \tilde{x}\|_2^2 \quad (7)$$

CNN represents a convolution network of the U-net that generates a full low-rank image set from a sparse low-rank image set. $G_{dc}^{H-}$ is an operator that performs gridding of a data string of k-space data in Cartesian k-space. "$\tilde{F}^H \cdot \tilde{G}_{dc}^H \cdot \tilde{G} \cdot \tilde{F} \cdot \tilde{x}$" in CNN represents an operation for obtaining a sparse low-rank image set from a full low-rank image set.

The first term in formula (7) represents data consistency, calculating a difference between a k-space data set $(\tilde{G} \cdot \tilde{F} \cdot \tilde{x})$ obtained from the full low-rank image set using the trained model and a k-space data set (S) obtained in step S201. The second term in formula (7) represents an accuracy of the trained model (consistency of learning), calculating a difference between the full low-rank image set obtained by applying the trained model to the sparse low-rank image set obtained from the full low-rank image set and the original full low-rank image set.

An optimum solution can be obtained by repeating convergence while correcting the full low-rank image set $\tilde{x}$ to minimize the value of formula (7). For example, although the CG method can be used to solve formula (7), it is preferable to use a non-linear CG method, because the formula for searching for a minimum value includes processing by the trained model.

In this case, steps S203, S204, and S205 are performed in integration with the CG method and the non-linear CG method.

Next, a first example of an output result from the medical data processing apparatus 1 according to the first embodiment will be described with reference to FIG. 12.

The upper portion of FIG. 12 shows five sparse low-rank images. Of the five sparse low-rank images shown in FIG. 12, an image having the largest singular value is set as rank 1, and an image having the smallest singular value is set as rank 5. The lower portion of FIG. 12 shows five full low-rank images which are generated from the five sparse low-rank images of the upper portion by the medical data processing apparatus 1 according to the first embodiment and which respectively correspond to the ranks of the sparse low-rank images.

As shown in FIG. 12, the sparse low-rank images of rank 3 to rank 5 have singular values smaller than those of upper ranks (rank 1 and rank 2), and are not distinguishable because of much noise. However, the medical data processing apparatus 1 according to the first embodiment can generate full low-rank images having high S/N ratios even for rank 3 to rank 5.

Next, a second example of an output result from the medical data processing apparatus 1 according to the first embodiment will be described with reference to FIG. 13.

Figure 13:
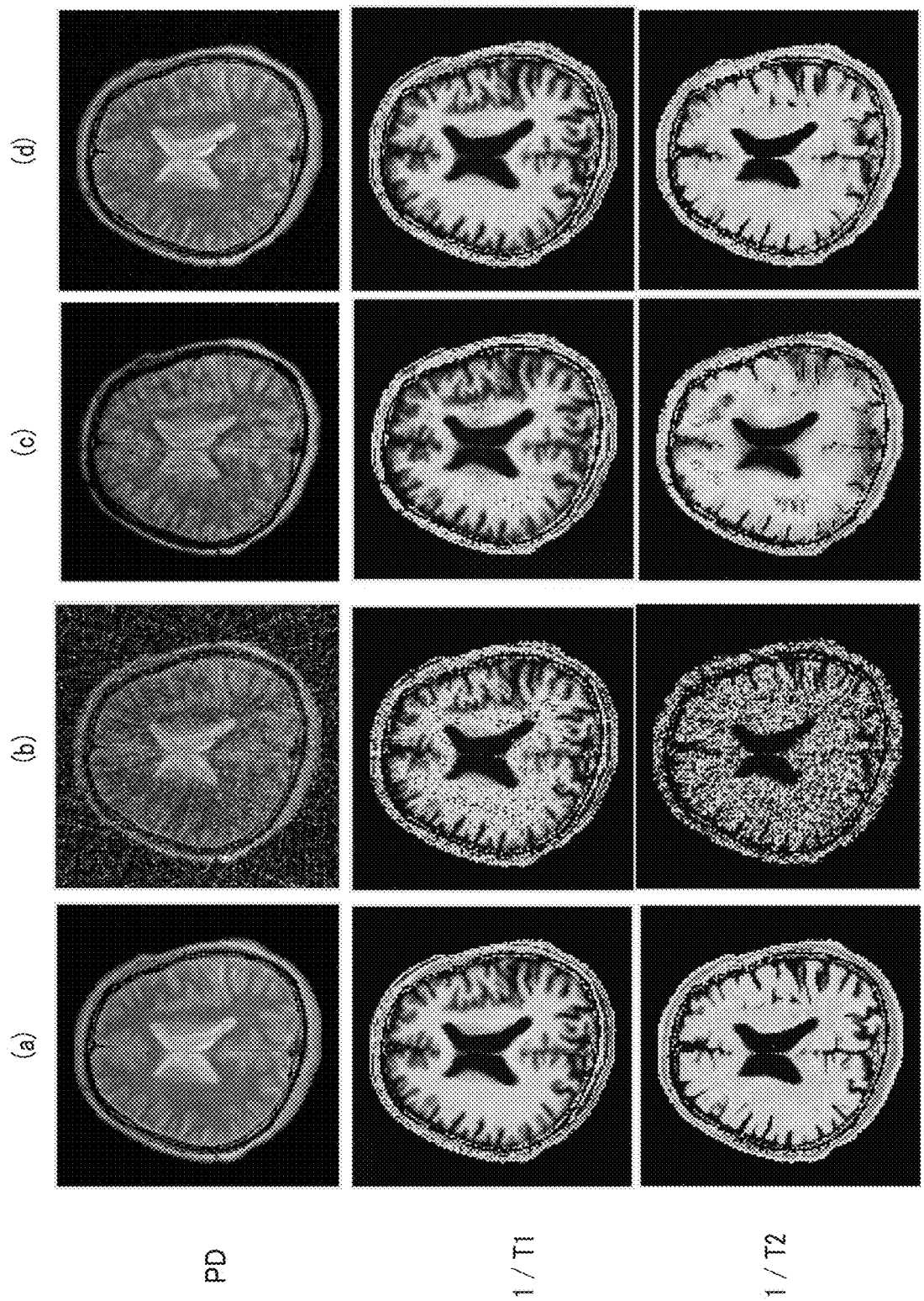
FIG. 13 is a drawing showing a second output example of the medical data processing apparatus according to the first embodiment.

FIG. 13 shows estimation results of PD, 1/T1, and 1/T2, which are quantitative values estimated from the five full low-rank images as an output result from the medical data processing apparatus 1.

FIG. 13(a) shows correct answer data. FIG. 13(b) shows estimation values obtained by conventional dictionary matching for comparison. FIG. 13(c) shows a result of optimization processing, in which the number of times of trained model application processing is 1. FIG. 13(d) shows a result of optimization processing, in which the number of times of trained model application processing is 10. As the optimization method, the approximated ADMM was used.

As shown in FIG. 13(b), according to the conventional dictionary matching method, much noise occurs and the accuracy of the estimation is low. In contrast, as is clear from FIG. 13(c) showing the result of the processing by the medical data processing apparatus according to this embodiment, the estimation accuracy of the image is improved even through one time of the trained model application processing. Furthermore, it is clear from FIG. 13(d) that the accuracy as high as that of the correct answer data of FIG. 13(a) is obtained by repeating the trained model application processing a plurality of times, and the estimation accuracy of images has further improved.

According to the first embodiment described above, the convolution network, such as U-net, trained by deep learning is applied to the sparse low-rank image set based on the sparse sampling k-space data set. As a result, the full low-rank image set based on the full sampling k-space data is generated. Accordingly, the full low-rank image set can be output from the sparse low-rank image set at a high speed with high accuracy. Furthermore, since the full low-rank image can be generated at a high speed with high accuracy, high-speed and accurate parameter estimation can be performed also when a T1 value and a T2 value are calculated later by subsequent processing. For example, as compared to the general dictionary matching by a general diallel method, the data processing apparatus according to the present embodiment can generate images at a speed of 10 to 1000 times higher. Thus, the calculation time and the accuracy can be significantly improved.

Second Embodiment

The second embodiment can be implemented for k-space data but not for real-space images.

Figure 14:
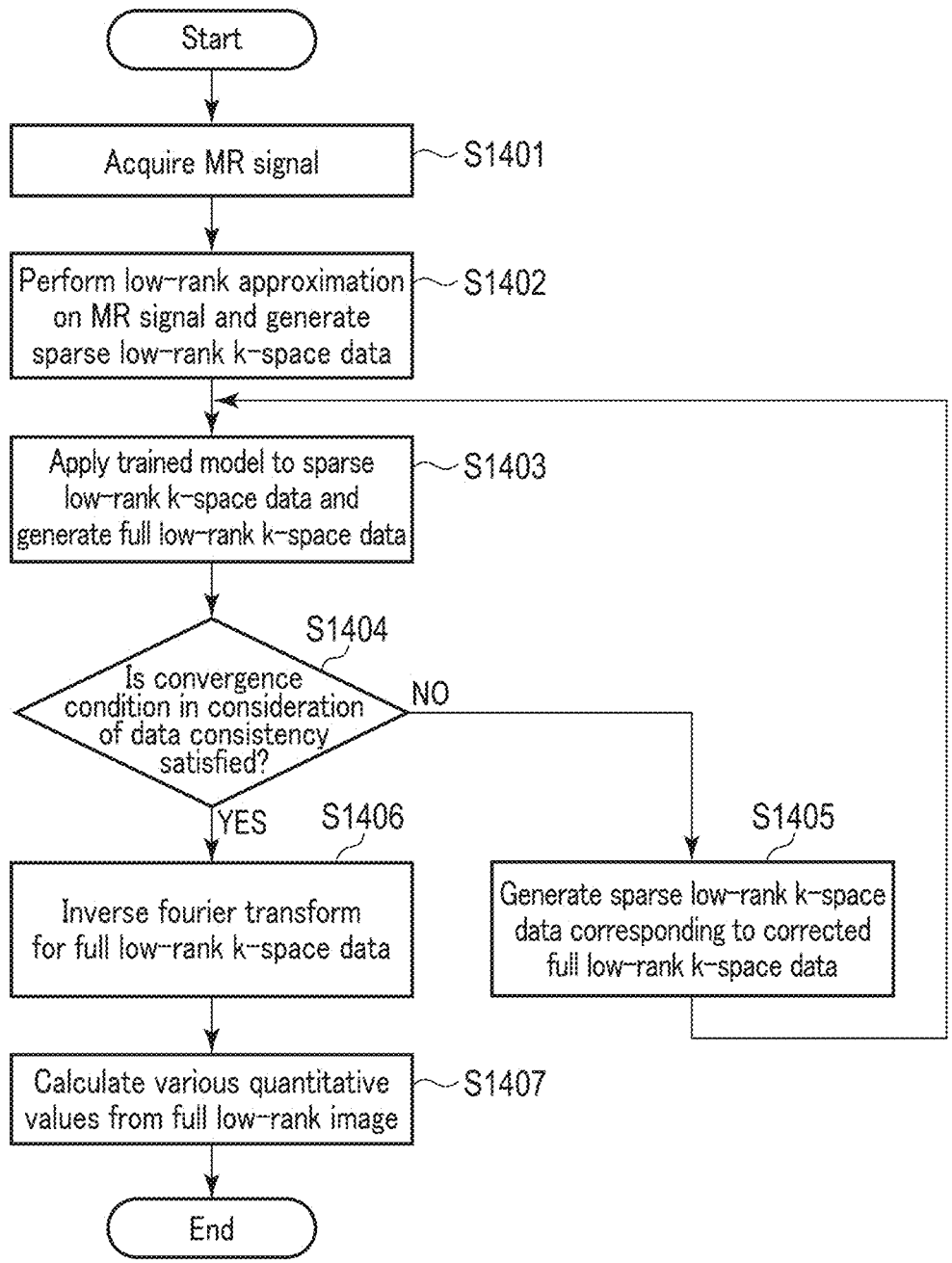
FIG. 14 is a flowchart showing an operation of the medical data processing apparatus according to a second embodiment.

The operation of the medical data processing apparatus 1 according to the second embodiment will be explained with reference to the flowchart of FIG. 14.

In step S1401, the processing circuitry 2 collects MR signals through the predetermined sparse sampling imaging sequence through the acquisition function 21, and acquires N pieces of integrated k-space data.

In step S1402, through the generation function 22, the processing circuitry multiplies the acquired N pieces of k-space data by the M sets of N weight coefficients, respectively, and adds the products, thereby generating M pieces of sparse low-rank k-space data. The weight coefficients for use in weighting the k-space data set may be those in the look-up table used for the processing of real-space images in the first embodiment. Alternatively, a look-up table specializing in processing of k-space data sets may be prepared, so that weight coefficients can be determined from the look-up table. For example, data may be retrieved at random from a full sampling k-space data set to prepare a data set. This data set is subjected to the SVD, so that weight coefficients for the k-space data set can be determined.

In step S1403, through the optimization function 23, the processing circuitry 2 applies the trained model to the M pieces of sparse low-rank k-space data, thereby generating M pieces of full low-rank k-space data. The trained model used here is a U-net trained to generate M pieces of full low-rank k-space data from M pieces of sparse low-rank k-space data.

In step S1404, through the optimization function 23, the processing circuitry 2 generates a checking k-space data set from the M pieces of full low-rank k-space data obtained using the trained model, and determines whether the error function including an evaluation of a difference from the k-space data set acquired in step S1402 satisfies the convergence condition in consideration of the data consistency. Specifically, if the value of the error function is equal to or smaller than the threshold value, the processing circuitry 2 determines that the convergence condition is satisfied and proceeds to step S1406. If the value of the error function is greater than the threshold value, the processing circuitry 2 determines that the convergence condition is not satisfied and proceeds to step S1405.

In step S1405, through the optimization function 23, the processing circuitry 2 newly generates M pieces of corrected full low-rank k-space data and the corresponding sparse low-rank k space data, returns to step S1403, and repeats the processing until the convergence condition is satisfied.

In step S1406, for example through the generation function 22, the processing circuitry 2 performs the inverse Fourier transform for the M pieces of full low-rank k-space data, thereby generating M full low-rank images.

In step S1407, through the estimation function 24, the processing circuitry 2 calculates a T1 value, a T2 value, and a PD value from the M full low-rank images generated in step S1406. The method for calculating the T1 value, the T2 value, and the PD value from the M full low-rank images is the same as that in the first embodiment.

In the flowchart described above, it is assumed that the optimization processing is performed by the approximated ADMM. However, the processing may be performed in the same manner as in the first embodiment.

Next, an example of an output result from the medical data processing apparatus 1 according to the second embodiment will be described with reference to FIG. 15. Although the M pieces of full low-rank k-space data are actually output by applying the trained model to the M pieces of sparse low-rank k-space data, images obtained by the inverse Fourier transform of the data are compared for visibility.

Figure 15:
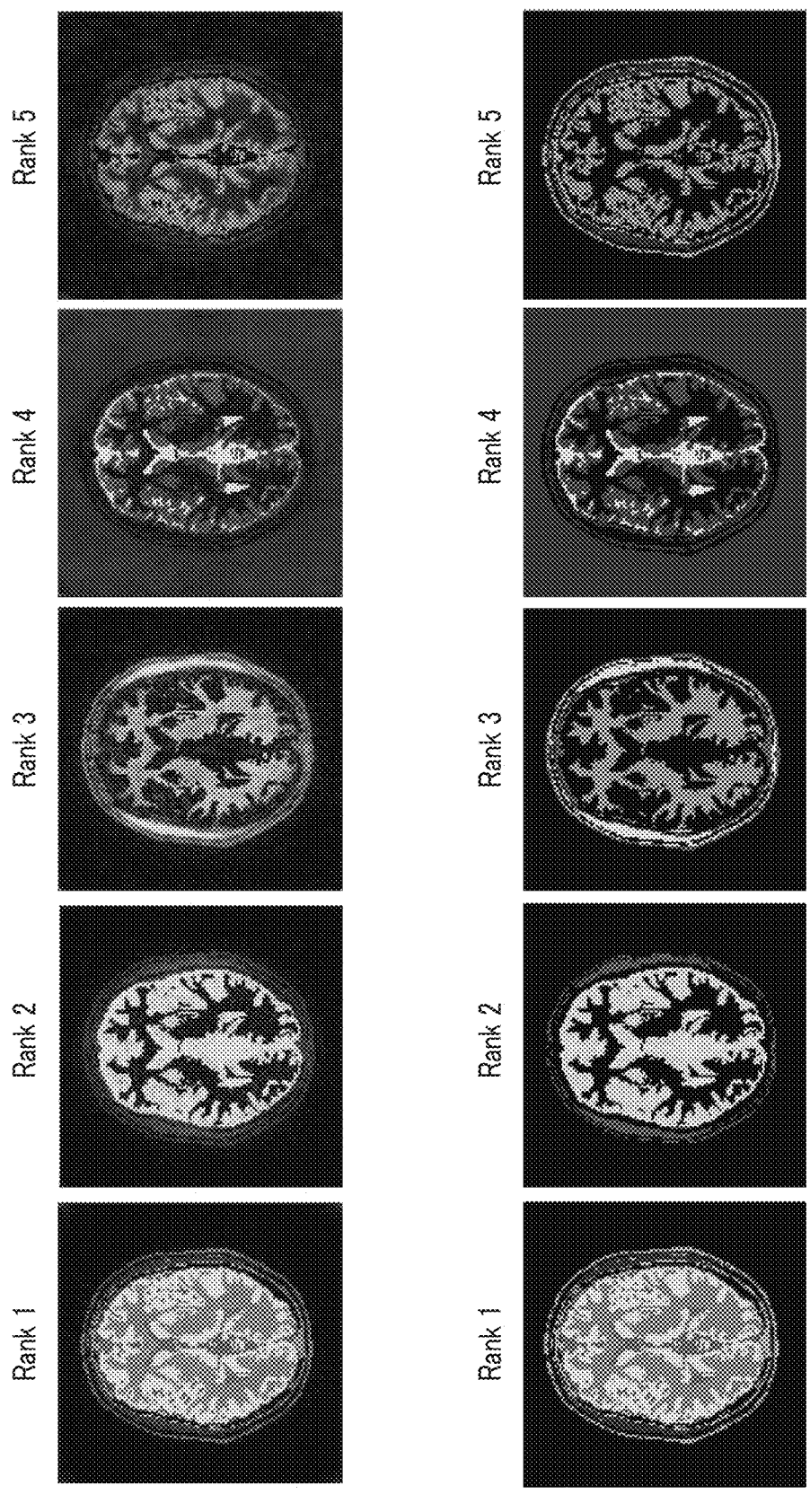
FIG. 15 is a drawing showing an output example of the medical data processing apparatus according to the second embodiment.

The upper portion of FIG. 15 shows five sparse low-rank images obtained from five pieces of sparse low-rank k-space data. An image having the largest singular value is set as rank 1, and an image having the smallest singular value is set as rank 5. The lower portion of FIG. 15 shows five full low-rank images obtained from the five pieces of full low-rank k-space data.

As shown in FIG. 15, it is evident that satisfactory estimation results were obtained for rank 1 to rank 5.

Furthermore, it is possible to estimate a full low-rank data set from a sparse low-rank data set using a hybrid space data instead of mere k-space data. Hybrid space data is a type of k-space data in which the inverse Fourier transform is performed for a certain dimension and the inverse Fourier transform is not performed for another dimension. For example, in the case of three-dimensional (3D) imaging, if the inverse Fourier transform is performed for only a slice direction, namely, a kz direction, and the inverse Fourier transform is not performed for a kx direction and a ky direction, the space (kx, ky, z) corresponds to hybrid space. The hybrid space can contribute to simplification of the processing in the 3d imaging.

Next, data processing of the medical image processing apparatus using sinogram real-space data will be explained with reference to FIG. 16.

FIG. 16 shows a concept of data processing of the medical data processing apparatus according to the second embodiment. The sinogram real-space data used here is data in which if radial scanning is adopted as the k-space scanning method, one-dimensional inverse Fourier transform along each spoke is performed for the spoke, and the obtained data is represented in the form of coordinates. In the coordinates, the vertical axis represents position information along the spoke and the horizontal axis represents an angle direction (θ direction) of the spoke.

For example, through the generation function 22, the processing circuitry 2 subjects the k-space data collected by radial scanning to one-dimensional inverse Fourier transform along the spoke, and thereafter arranges the data in the θ direction. Thus, measurement sinogram real-space data 1601 is generated. Next, the respective spokes (respective angles θ) of the sinogram real-space data 1601 are multiplied by M sets of corresponding weight coefficients, thereby generating M pieces of sparse low-rank sinogram real-space data 1602.

Next, through the optimization function 23, the processing circuitry 2 applies the trained model to the generated M pieces of sparse low-rank sinogram real-space data 1602, thereby generating M pieces of full low-rank sinogram real-space data 1603. The trained model may be obtained, in the same manner as in the case of k-space, by learning U-net using a plurality of pairs of training data of M pieces of full low-rank sinogram real-space data as correct answer data and M pieces of sparse low-rank sinogram real-space data as input data Subsequently, through the optimization function 23, the processing circuitry 2 obtains from the generated N pieces of full low-rank sinogram real-space data 1603 the corresponding measurement data by calculation, thereby generating checking sinogram real-space data.

Then, the measured sinogram real-space data 1602 and the checking sinogram real-space data are compared with each other, and converged by, for example, an optimization method using the CG and the approximated ADMM, so that the value of the error function including an evaluation of the difference as a result of the comparison can be equal to or smaller than the threshold. Thus, M pieces of optimum full low-rank sinogram real-space data 1603 can be estimated. Even if the 1D inverse Fourier transform along the spoke is not performed and the data is displayed in the sinogram k-space in which the vertical axis represents kr (wave number in radial directions of the spokes in the k-space) and the horizontal axis represents the angle θ of the spoke, similar processing can be performed.

The sinogram real-space data and the sinogram k-space data have characteristics in which the radial spokes of each piece of data are independently displayed and therefore all measurement data points are displayed. On the other hand, if the measurement data of radial imaging are gridded in Cartesian coordinates, many data points overlap at the center of k-space (where kx and ky are nearly zero), and the number of data points is reduced. Therefore, information of all measured data points cannot be utilized.

When results of imaging are reconstructed, transform (gridding) from radial coordinates to Cartesian coordinates or vice versa is necessary. If a matrix for this purpose is calculated by non-uniform FFT (NuFFT) or the like, the matrix will be very large and much memory capacity will be required to reconstruct a high-resolution image. On the other hand, in sinogram real-space data and sinogram k-space data, all spokes and all data points are independently represented, and a large matrix is not required to perform regridding. A memory capacity that can only process low-rank images and a matrix of weight coefficients to restore the data is required. Even if high resolution imaging is performed, reconstruction can be performed with a practical memory capacity.

In the example described above, data are collected by using a trajectory of radial scanning. However, the data is not necessarily corrected by radial scanning, but may be collected by using a trajectory of spiral scanning.

In the case of using a trajectory of spiral scanning, a trained model may be generated for pseudo sinogram k-space data in which a k-space trajectory of one shot is linearly extended and represented as a vertical axis, and a rotation angle of the spiral is represented in a horizontal axis, or pseudo sinogram real-space data in which a 1D inverse Fourier transform is performed along the trajectory. Using the trained model, the data processing may be performed. Even when data is collected by other non-Cartesian scanning, similar processing and training can be performed.

The second embodiment described above uses the trained model obtained through machine-learning of a set of k-space data, hybrid space data, sinogram real-space data, and sinogram k-space data. Thus, it is possible to estimate a full sampling data set from a sparse sampling data set in the k-space, hybrid space, sinogram real space, and sinogram k-space, and the same processing as in the first embodiment can be performed. In the k-space, hybrid space, sinogram real space, and sinogram k-space, the Fourier transform or gridding processing may be unnecessary or may be reduced. In particular, in the case of 3D imaging, the second embodiment is more advantageous than the first embodiment in regards to the calculation time and the memory capacity.

Third Embodiment

In the above description of the first and second embodiments, a two-dimensional image has been described as an example. Data processing by the medical data processing apparatus adapted to three-dimensional imaging will now be described.

An example of an imaging sequence according to the third embodiment will be explained with reference to FIG. 17.

As the imaging sequence and scanning method, radial scanning is performed by IR-bSSFP in the same manner as in the embodiments described above.

Figure 17:
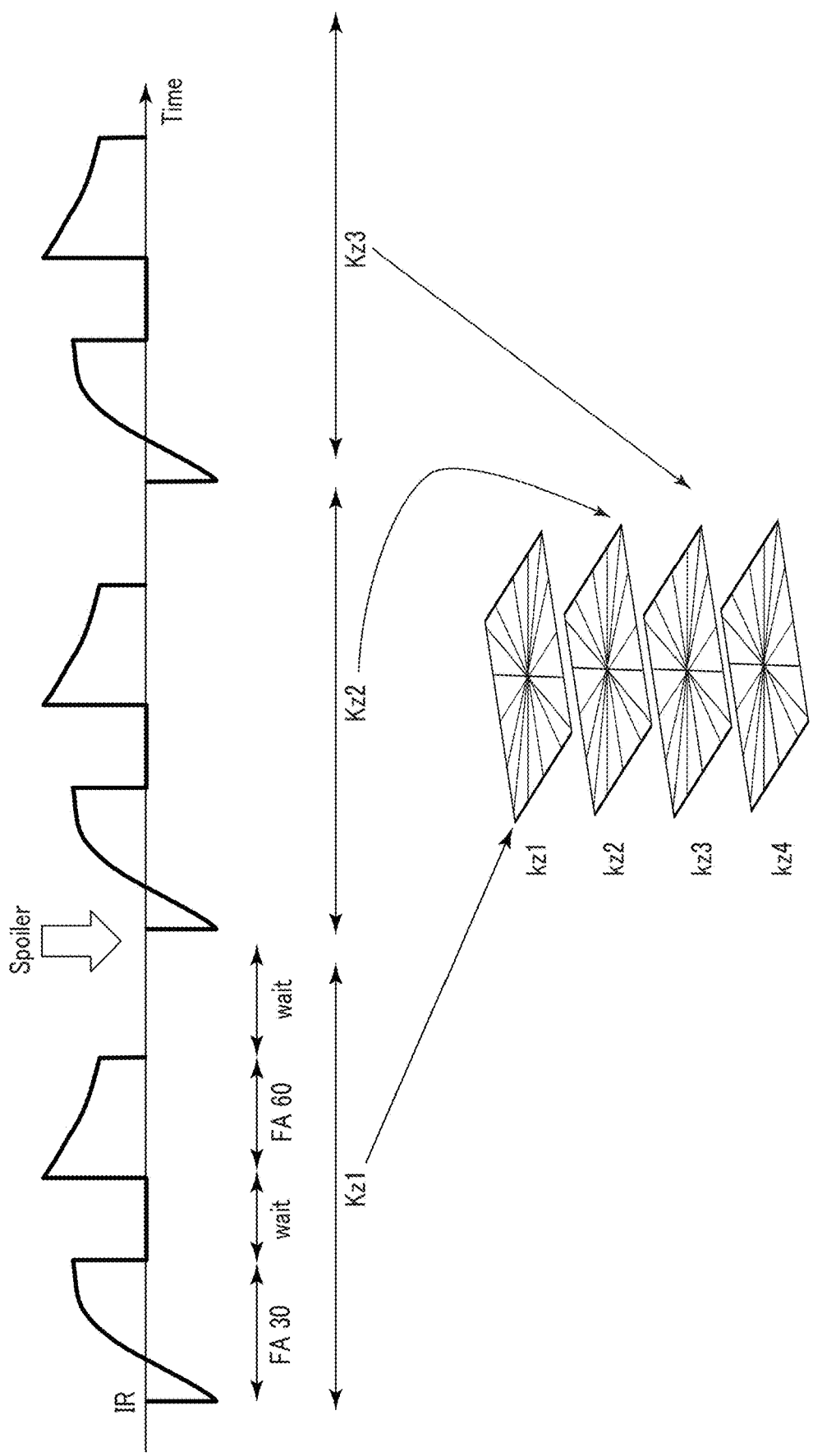
FIG. 17 is a diagram showing an example of imaging sequence according to a third embodiment.

In the example of FIG. 17, immediately after an IR pulse of 180° is transmitted, 400 shots of imaging at a flip angle of 30° are performed. Then, after two seconds of waiting time, 400 shots of imaging at a flip angle of 60° are performed.

After about two seconds of waiting time, MR signals are collected in a plurality of cycles, one cycle corresponding to a period elapsed until horizontal magnetization is dissipated by a spoiler. The imaging time of one cycle is about eight seconds, which is fully longer than the time corresponding to the T1 value generally measured from a subject. It is considered that the signal intensities of voxels in the respective cycles are almost the same.

At this time, phase encoding in the kz direction is performed while a gradient magnetic field is also being applied in the z axis direction in each cycle. Then, imaging is performed by selecting a kz slice. That is, when imaging one cycle, the position in the kz direction is fixed and MR signals are collected while changing the spoke angle on a kx-ky plane, so that the k-space can be filled with the signals. In the next cycle, the gradient magnetic field intensity is changed to change the position in the kz direction, and MR signals to fill the k-space on a kx-xy plane of another kz slice are collected. Imaging of one cycle is repeated under the same conditions except for the difference in the position in the kz direction. In the example shown in FIG. 17, imaging is performed while sequentially changing kz to be kz1, kz2, kz3, and kz4. The order of kz slices on which imaging is performed is not necessarily sequentially changed, but may be centrically changed from kz=0, or may be changed in an interlacing manner, or in any other manner.

The operation of the medical data processing apparatus 1 according to the third embodiment will be explained with reference to the conceptual diagram of FIG. 18. In the following explanation, the number of ranks is assumed to be five and the number of slices is assumed to be five.

Through the generation function 22, the processing circuitry 2 multiplies the acquired sparse sampling k-space data sets $S_{kz1\sim5}$ by five sets of weight coefficients in each kz slice, namely, each cycle, and adds the products, thereby generating five pieces of sparse low-rank k-space data for each of the k-space data sets $S_{kz1\sim5}$. The sparse low-rank k-space data is expressed by the following formula (8):

$$\tilde{k}'^{FS\ R1-5}_{kz1-5} \qquad (8)$$

Next, through the generation function 22, the processing circuitry 2 integrates five pieces of sparse low-rank k-space data for each kz slice in the kz direction, and generates five pieces of three-dimensional sparse low-rank k-space data. The three-dimensional sparse low-rank k-space data is subjected to three-dimensional inverse Fourier transform, so that five three-dimensional sparse low-rank images are generated. The number of slices in the z direction of the images is the same as the number of slices of the kz planes.

The five sparse low-rank images of the five slices are represented by the following formula (9):

$$\tilde{x}^{SS\ R1-5}_{z1-5} \qquad (9)$$

Subsequently, through the optimization function 23, the processing circuitry 2 applies the trained model (U-net) to the sparse low-rank image set of each slice, thereby generating a full low-rank image set of each slice. Since the processing can be performed for each slice, the image set can be generated in the same manner as in the case of a two-dimensional full low-rank image set described above.

The five full low-rank images of the five slices are represented by the following formula (10):

$$\tilde{x}'^{FS\ R1-5}_{z1-5} \qquad (10)$$

Through the optimization function 23, the processing circuitry 2 integrates all of the full low-rank images of the respective slices in the z direction to form a three-dimensional full low-rank image. The image is transformed to three dimensional full low-rank k-space data by the three-dimensional Fourier transform.

The five pieces of full low-rank k-space data of the five slices are represented by the following formula (11):

$$\tilde{k}'^{FS\ R1-5}_{kz1-5} \qquad (11)$$

Through the optimization function 23, the processing circuitry 2 performs processing to obtain a checking k-space data set $S'_{kz1\sim5}$ for each slice from the full low-rank k-space data set of each slice.

Through the optimization function 23, the processing circuitry 2 compares the k-space data set $S_{kz1\sim5}$ acquired through real imaging with the checking k-space data set $S'_{kz1\sim5}$, so that a repetition of processing similar to that of the embodiment described above can be performed.

Figure 18:
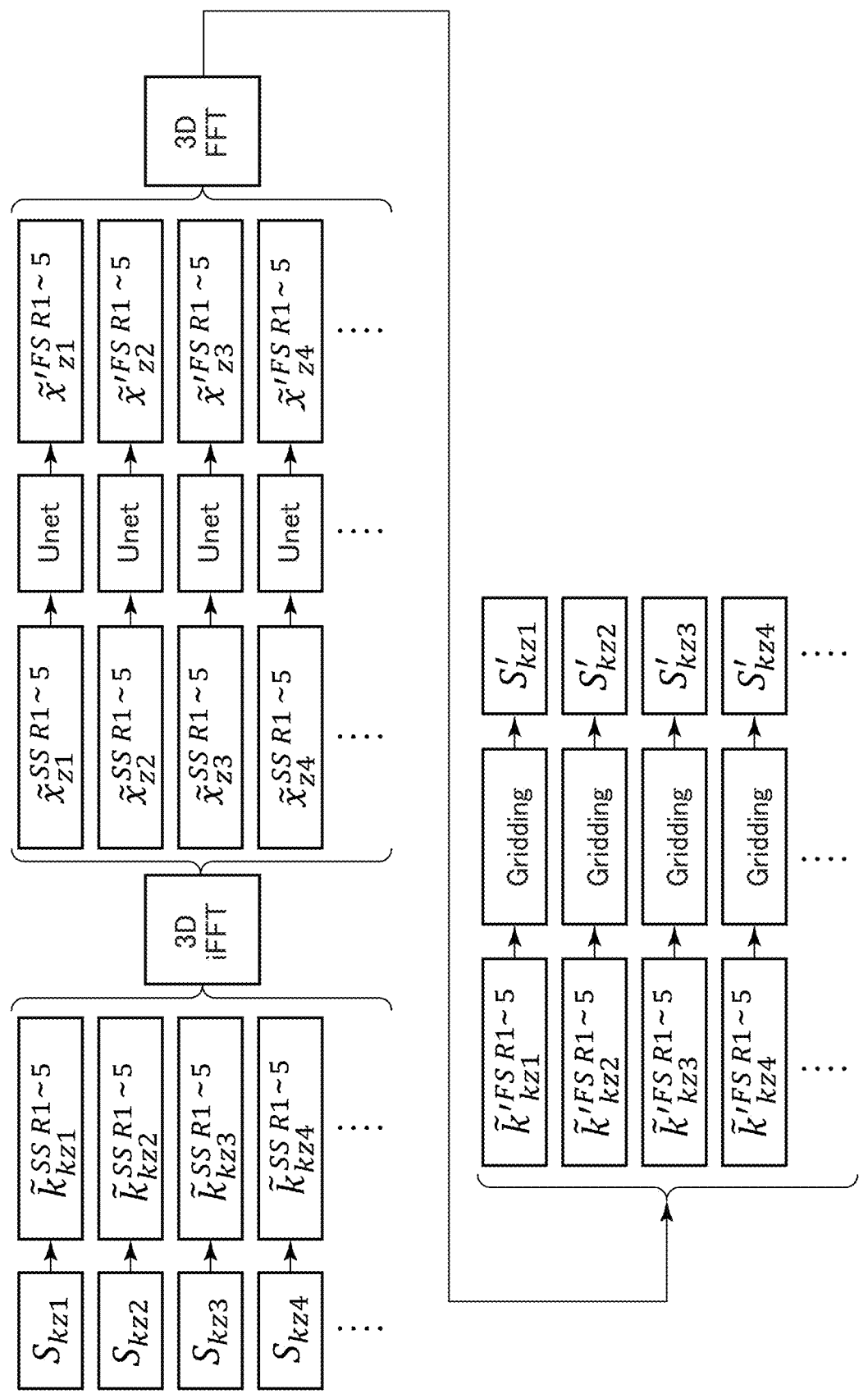
FIG. 18 is a conceptual diagram showing data processing of a medical data processing apparatus according to the third embodiment.

The example shown in FIG. 18 has been described using the trained model obtained by training with a real-space image set. However, a trained model obtained by training with a k-space data set may be used.

The operation of the medical data processing apparatus 1 according to the third embodiment, in which a trained model obtained by training with a k-space data set is used, will be explained with reference to FIG. 19.

Figure 19:
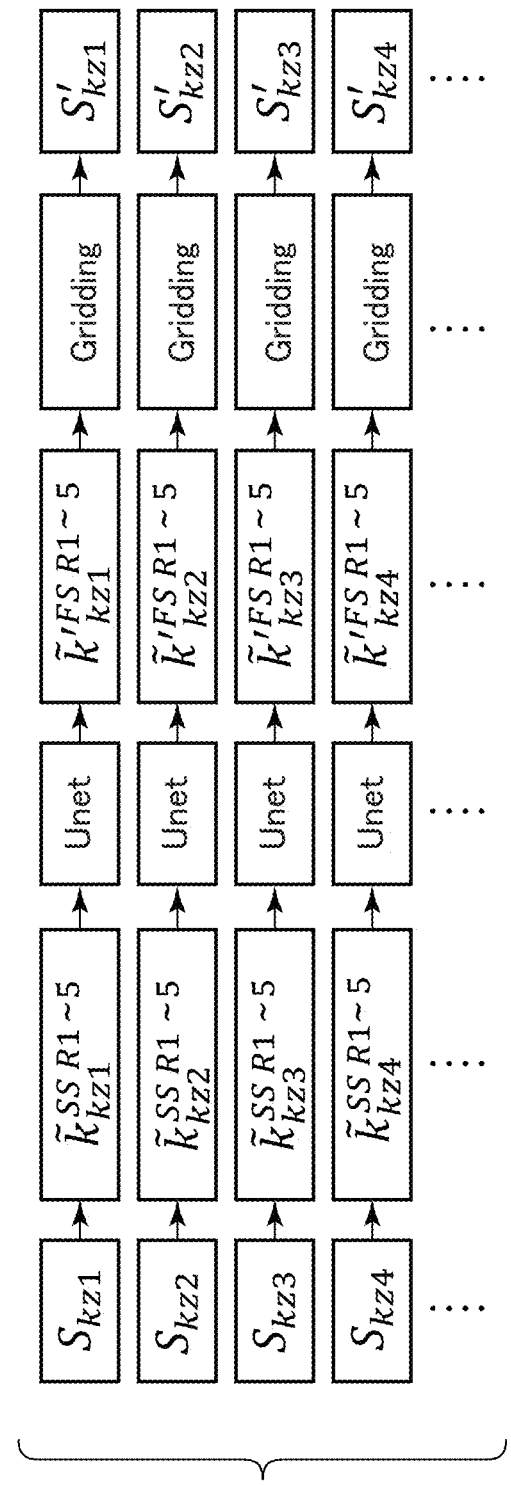
FIG. 19 is a diagram showing an operation of the medical data processing apparatus according to the third embodiment when using a trained model trained for k-space data.

As shown in FIG. 19, when the trained model relating to the k-space data set is learned and utilized, it is possible to generate five pieces of full low-rank k-space data directly from the five pieces of sparse low-rank k-space data without generating a sparse low-rank image set of each slice obtained by three-dimensional Fourier transform and three-dimensional inverse Fourier transform. Thus, the time for calculation necessary for three-dimensional Fourier transform and three-dimensional inverse Fourier transform can be saved.

In the case of learning with the k-space data set, the trained model may be prepared as an exclusive U-net for each kz slice by separately training for the respective kz slices, or prepared by applying one U-net to be trained for all kz slices.

Also, in the case of the three-dimensional imaging, the U-net obtained by training in a sinogram real-space and sinogram k-space can be used in the same manner as in the two-dimensional imaging. In this case, as in the case of the 2D imaging, gridding processing may be lightened.

An output result from the medical data processing apparatus according to the third embodiment will be described with reference to FIG. 20.

Figure 20:
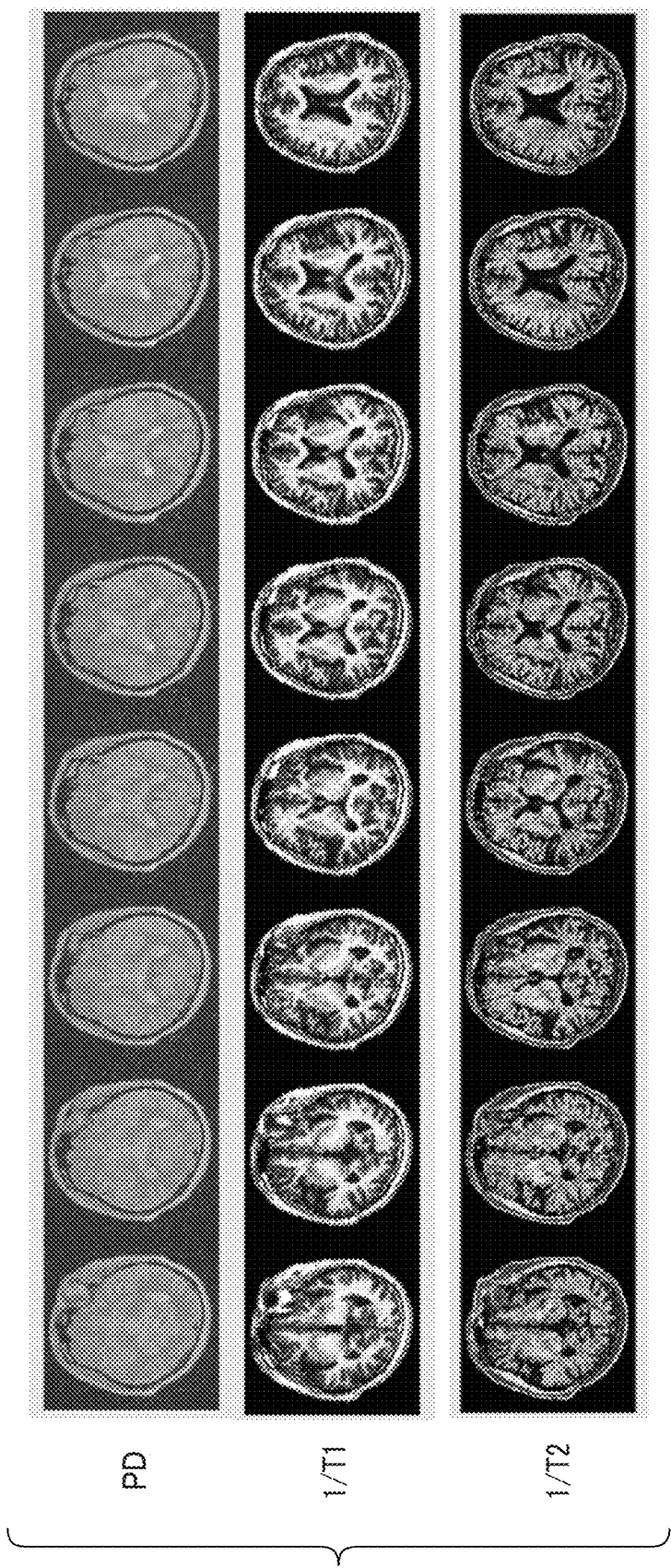
FIG. 20 is a drawing showing an output example of the medical data processing apparatus according to the third embodiment.

FIG. 20 shows images of eight slices of a head part. The upper portion of FIG. 20 shows PD images, the middle portion shows 1/T1 images, and the lower portion shows 1/T2 images. As shown in FIG. 20, slice images keeping the same signal intensity can be generated. As a result, a three-dimensional image can be generates at a high speed with a high accuracy.

(Modification of Third Embodiment)

As a modification of the third embodiment, a case in which slices in the kz direction are processed by parallel imaging will be explained with reference to FIG. 21.

Figure 21:
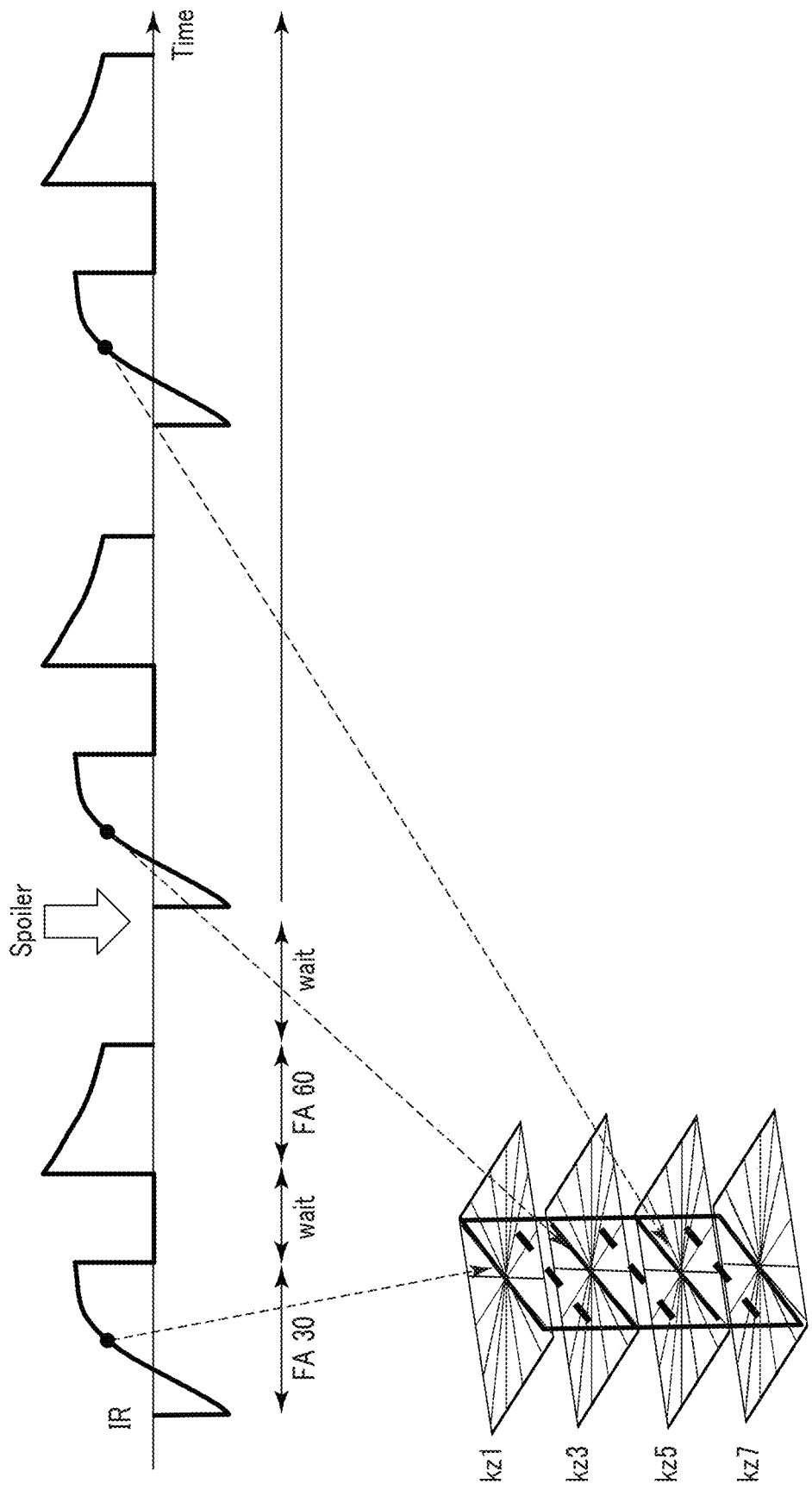
FIG. 21 is a diagram showing a concept of a case in which processing is performed by parallel imaging according to a modification of the third embodiment.

FIG. 21 shows an imaging sequence similar to that shown in FIG. 17. In this modification, every other slice of the kz planes is skipped (decimated) to collect MR signals. In the example shown in FIG. 21, the MR signals are collected to fill the k-spaces of the respective slices of kz1, kz3, kz5, and kz7.

The slices of the kz planes that were not imaged are interpolated by parallel imaging. Specifically, since the spoke angles are divided in the same manner in all cycles, the n-th collected spokes in the respective cycles form the same angle in all cycles and are on one kz-kr plane. Furthermore, since the timing of imaging the n-th spoke is the same in all cycles, the spokes constituting the plane are image data at the moment when all observation targets have the same signal intensity (contrast).

Therefore, when the plane is subjected to the two-dimensional inverse Fourier transform, a two-dimensional image on which the observation target is projected on the plane can be obtained. In addition, in the z direction, aliasing occurs due to an influence of collecting data of every other slice in the k-space. Therefore, using imaging data of multiple coils and a sensitivity map, general parallel imaging (so-called SENSE or SPEEDER) may be performed.

Images in which aliasing is unfolded are obtained at all spoke angles. Therefore, by Fourier transform of the images, k-space data of kz slices that were not imaged can be interpolated. Using the interpolated k-space data, the optimization processing may be performed through the optimization function 23 as described above.

According to the processing by the modification, since a framework of the general parallel imaging can be used, the modification is advantageous in that a library used in general MRI apparatuses can be utilized. Furthermore, according to the parallel imaging, since the number of slice images on the kz plane can be halved, the entire imaging time can be halved.

According to the third embodiment described above, imaging of one kz slice is performed in one cycle, and a plurality of cycles are repeated to perform three-dimensional imaging. Since processing other than the three-dimensional Fourier transform and the three-dimensional inverse Fourier transform can be performed slice by slice, the other processing can be performed in the same manner as in the case of two-dimensional processing. Therefore, even in the optimization processing corresponding to the three-dimensional imaging, the memory cost and the calculation cost can be reduced and the processing can be performed by using a computer with a general memory size. Accordingly, the cost can be reduced without preparing a special computer for three-dimensional reconstruction.

Fourth Embodiment

The third embodiment is an example in which the slice on one kz plane is imaged in one cycle. In the fourth embodiment, a plurality of kz slices may be integrally imaged as one group in a plurality of cycles.

An example of the imaging sequence according to the fourth embodiment will be explained with reference to FIG. 22.

Figure 22:
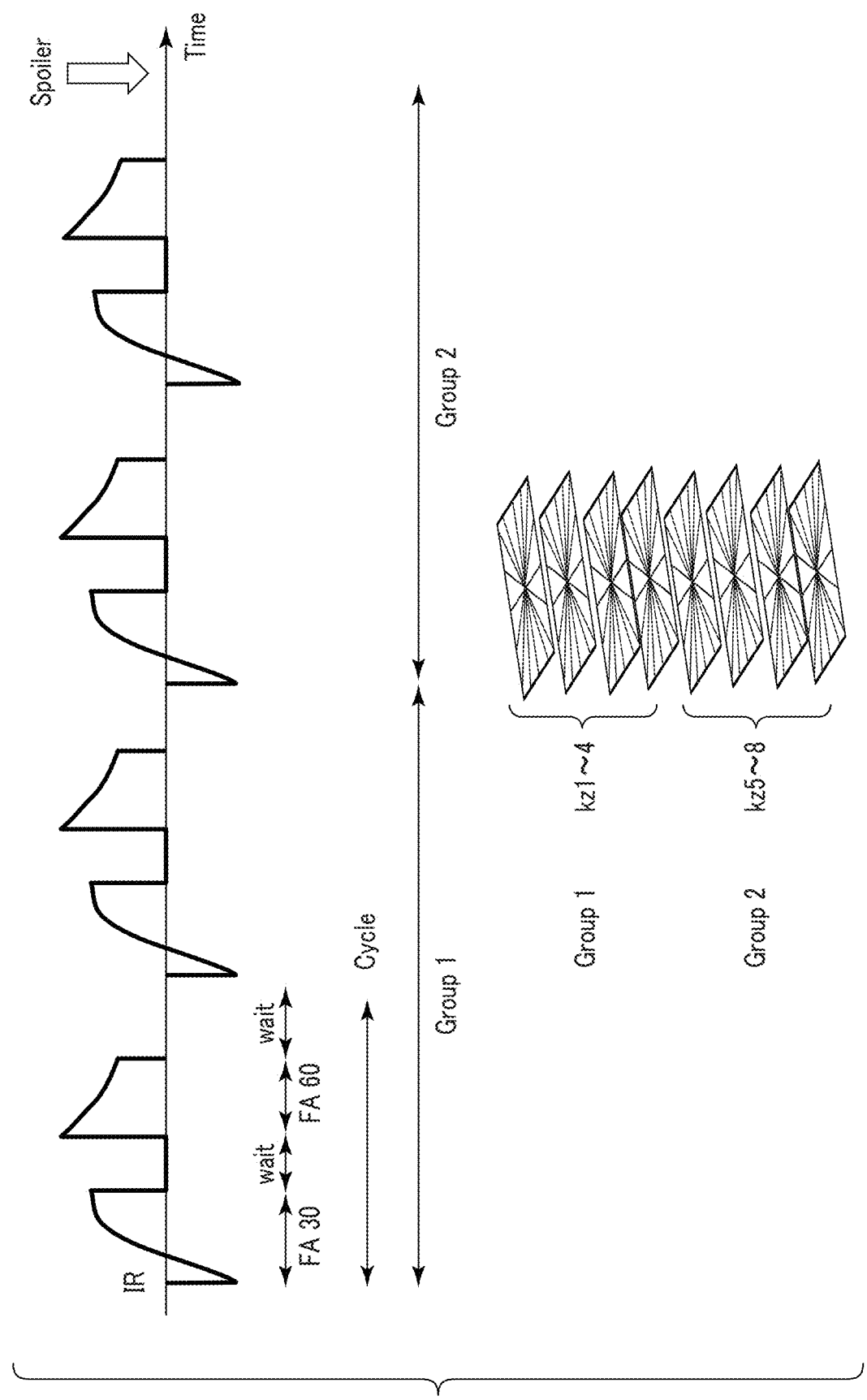
FIG. 22 is a diagram showing an example of imaging sequence according to a fourth embodiment.

In the example of FIG. 22, two cycles are integrated as one group, and four kz slices are imaged in the one group.

In this example, two cycles in the same group are assumed to be the same in imaging conditions, such as the FA, waiting time, IR, TR, TE, etc. The imaging sequence according to the fourth embodiment differs from the imaging method described above in that one of the slices on the four kz planes is selected by one shot in one cycle instead of filling one kz slice in one cycle. Therefore, k-space data of four kz slices are collected by one group. Collecting the k-space data by one group is repeated, thereby collecting k-space data of all necessary kz slices. In this case, to make the number of radial spokes on one plane the same as that in the case of imaging one slice in one cycle, the number of spokes to be collected in one cycle needs to be doubled. However, the number of spokes can be adjusted in accordance with required imaging accuracy.

In the fourth embodiment, to calculate a weight coefficient for low-rank approximation, a dictionary is created by Bloch simulation, in which a signal value in units of a group is changed in accordance with the T1 value and the T2 value. The dictionary is low-rank approximated by the SVD, and weight coefficients to be multiplied by the respective collected radial spokes are calculated.

After imaging, the medical data processing apparatus 1 performs the optimization processing for each group, not for each cycle, so that the same processing as in the case of the optimization processing for each cycle in the third embodiment can be performed.

Furthermore, even in the case of performing the processing for each group, the processing can be performed by parallel imaging with multiple coils. It is assumed that two cycles are integrated into one group, and eight kz slices are imaged by one group. At this time, assuming that the number of shots in one cycle is not changed, the number of kz slices that can be collected in the same period of time is doubled, and the time necessary to image one kz slice is halved. Therefore, the entire imaging time is halved, even though the number of spokes in one kz slice is halved.

An optimization processing in the case of using multiple coils will be explained with reference to the flowchart of FIG. 23.

In step S2301, through the acquisition function 21, the processing circuitry 2 acquires MR signals through coils in accordance with the imaging sequence described above. In this description, it is assumed that the head part of the subject is imaged by using 32-channel head coils. In this case, signals corresponding to 32 channels are obtained.

In step S2302, the processing circuitry 2 compresses the signals of the 32-channel coils to signals corresponding to a smaller number of virtual coils. If the signals of the 32 channels were directly used for the optimization processing, the necessary memory size would increase due to the large size of data to be processed, and the period of calculation time would also increase. To avoid this, the signals are compressed to signals as received by virtual coils of a number smaller than the actual number of channels. In this embodiment, it is assumed that the signals are compressed to signals as received by six-channel virtual coils. However, the number of signals is not limited to six, but may be appropriately changed in accordance with the data size that can be processed and the processing time. The compressing method may be, for example, integrating the signals acquired by the plurality of coils into the signals of the smaller number of virtual coils by the SVD or the like. In step S2303, through the generation function 22, the processing circuitry 2 low-rank approximates k-space data for each virtual coil, and generates a sparse low-rank k-space data set. In this embodiment, signals of six-channel virtual coils are multiplied by five sets of weight coefficients for each channel, and the products are added. As a result, five pieces of sparse low-rank k-space data are generated. Thus, data of one group are obtained from eight slices of the kz plane collected as a group, six channel virtual coils, and five pieces of low-rank k-space data. Accordingly, 8×6×5 (240) pieces of two-dimensional sparse low-rank k-space data are obtained.

In step S2304, through the optimization function 23, the processing circuitry 2 applies the trained model to the sparse low-rank k-space data set, thereby generating a full low-rank k-space data set.

In step S2305, through the optimization function 23, the processing circuitry 2 determines whether or not the error function including the data consistency satisfies the convergence condition. If the convergence condition is satisfied, the processing proceeds to step S2307, and if not, the processing proceeds to step S2306. The convergence condition is the same as that in the embodiments described above.

In step S2306, through the optimization function 23, the processing circuitry 2 newly generates a corrected full low-rank k-space data set, returns to step S2304, and repeats similar processing.

In step S2307, for example through the generation function 22, the processing circuitry 2 performs the inverse Fourier transform for the full low-rank k-space data set, thereby generating full low-rank images.

In step S2308, through the estimation function 24, the processing circuitry 2 calculates various quantitative values from the full low-rank images.

If the memory capacity and processing amount have no limitations, the MR signals of the coils used in the imaging may be directly processed in step S2303 without compressing the signals to those corresponding to virtual coils in step S2302.

Figure 23:
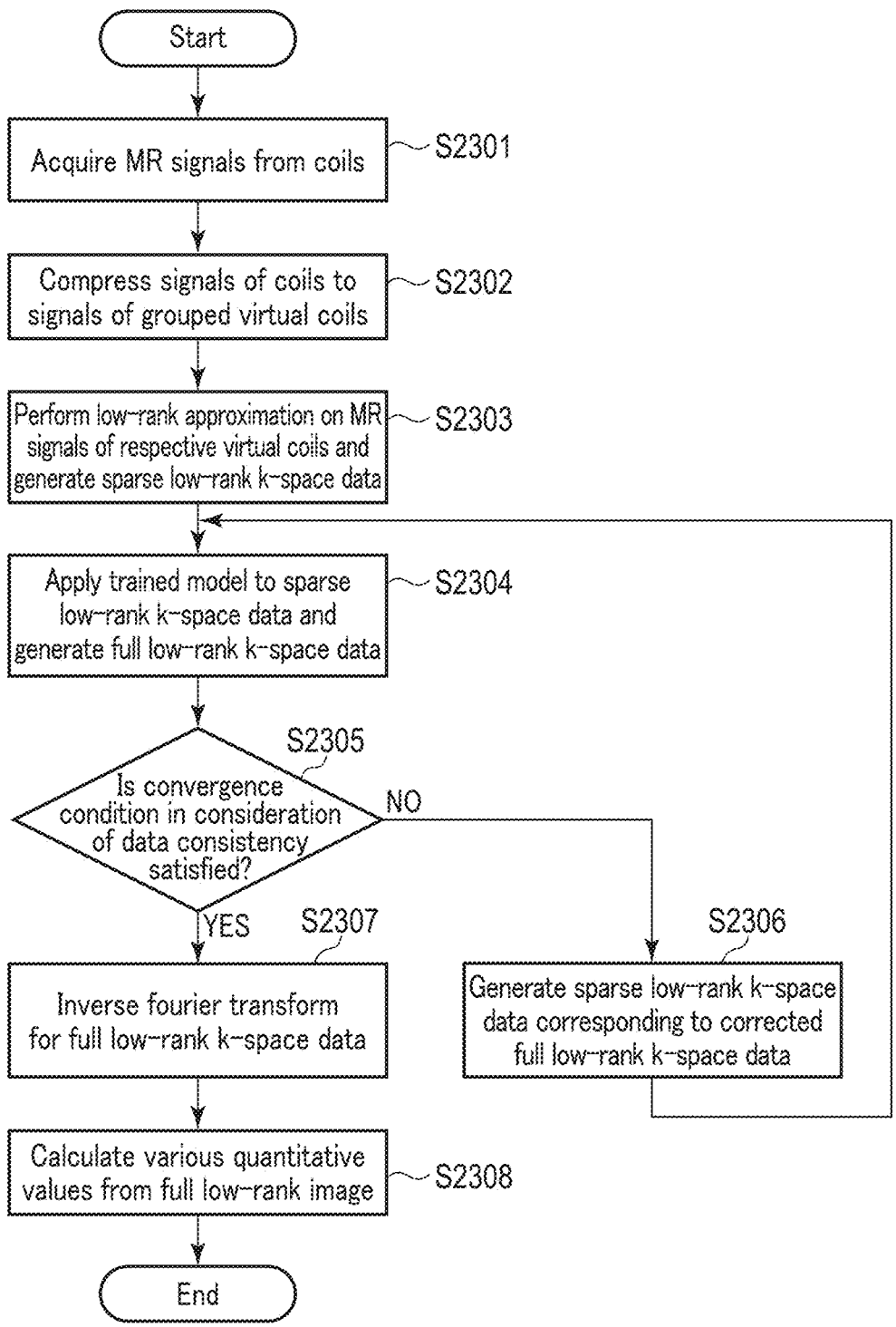
FIG. 23 is a flowchart showing optimization processing in a case of using multiple coils according to the fourth embodiment.

According to the optimization processing shown in FIG. 23, all of the MR signals acquired from the respective coils used for imaging can be utilized to generate full low-rank k-space data and full low-rank images.

When learning the trained model, the sparse low-rank k-space data to be learned may be divided into a plurality of units. An example of division of the data size is shown in FIG. 24.

Figure 24:
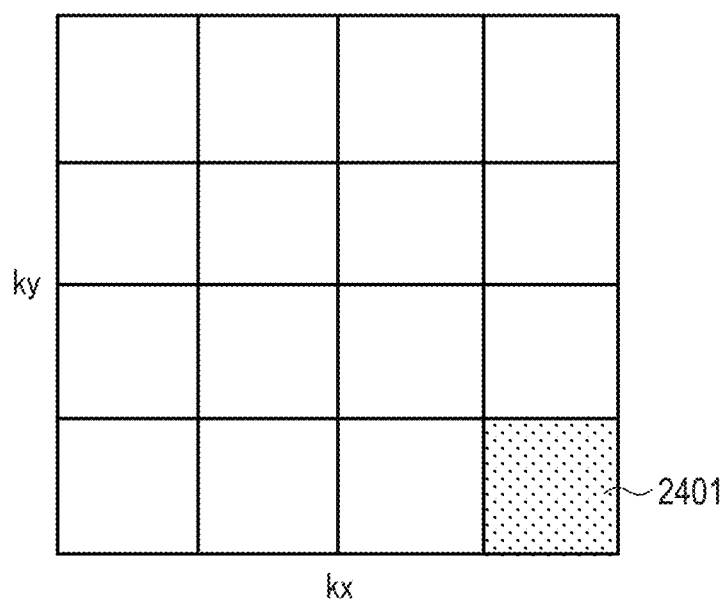
FIG. 24 is a diagram showing an example of division of a data size according to the fourth embodiment.

FIG. 24 shows two-dimensional data having a 256×256 voxel resolution in one slice.

Two dimensional data may be divided into 16 equal portions, and learned in units, each having a 64×64 resolution (hereinafter referred to as a patch 2401). By processing in units of patch 2401, the data size in learning can be reduced and the memory capacity can be lower.

When learning, a multilayered network may be used, in which the sparse low-rank k-space data set using the virtual coils is used as input data, and which outputs the full low-rank k-space data set using the virtual coils as correct answer data.

Thus, by collectively learning data of a plurality of coils, data interpolation in parallel imaging can be performed at the same time. Furthermore, by performing the patch learning in combination, the processing can be performed at a high speed with a reduced memory cost.

The estimation is performed by using the two-dimensional U-net (2D U-net) in the method described above, but may be performed by using a three-dimensional U-net (3D U-net). For example, the multilayered network may be learned by inputting a three dimensional patch of a 32×32×32(voxels)×6(ch)×5(rank) sparse low-rank k-space data set, so that a 3D patch of a full low-rank k-space data set can be output. In this case, since feature amount extraction and learning by three-dimensional convolution can be performed, three-dimensional space information can be utilized and higher accuracy can be expected as compared to the case of the two-dimensional U-net.

In the parallel imaging described above, the acceleration factor is 2.0, for example. However, the acceleration factor may be more than 2. Furthermore, the learning may be performed based on data created by simulation in advance, and thereafter transfer learning may be performed using actual imaging data.

Subsequently, a first imaging sequence example in a case of generating an apparent diffusion coefficient (ADC) or a diffusion weighted image as a quantitative value will be explained with reference to FIG. 25.

Figure 25:
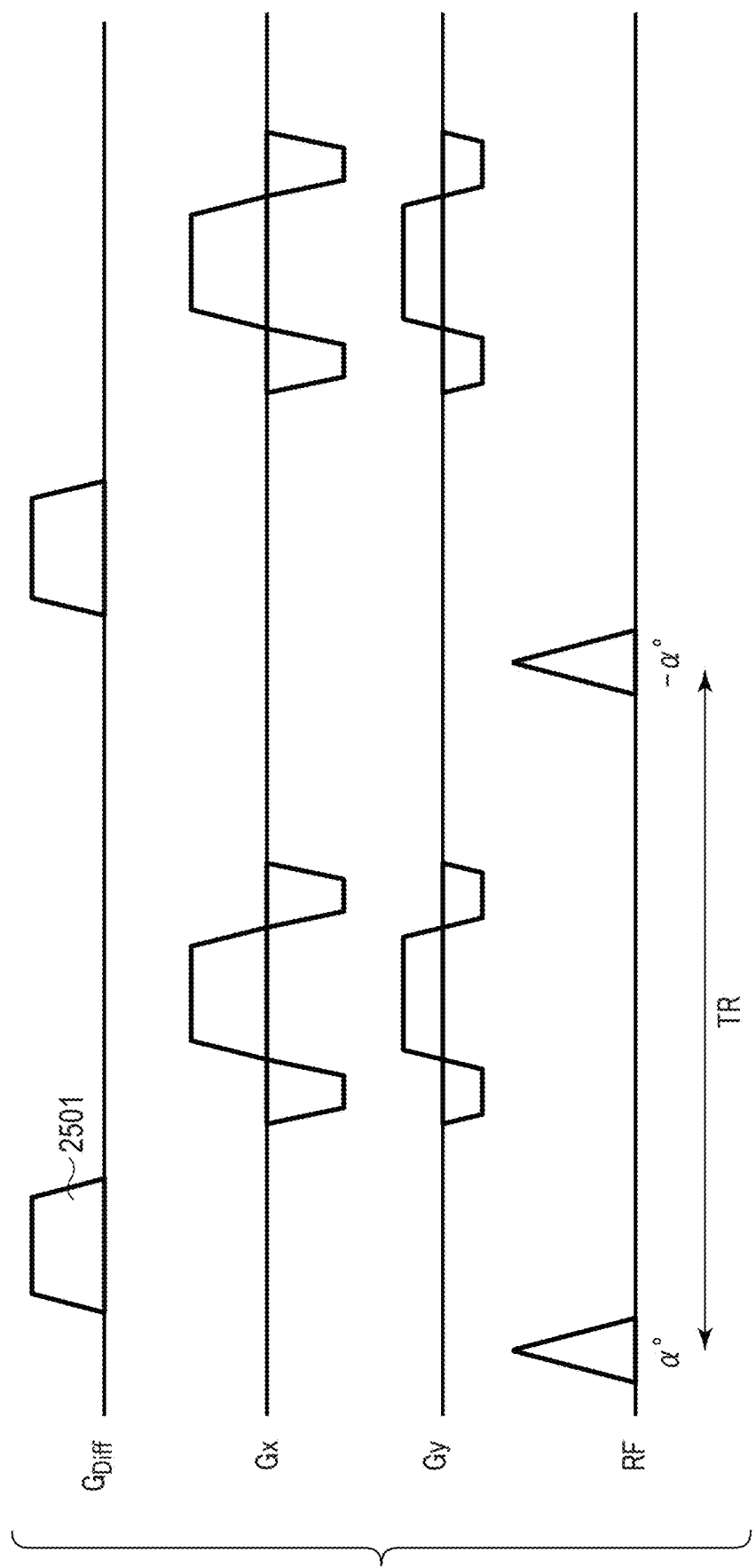
FIG. 25 is a diagram showing a first imaging sequence example in a case of calculating an apparent diffusion coefficient (ADC) or a diffusion weighted image as a quantitative value.

FIG. 25 shows a case in which two-dimensional radial scanning by SSFP is used.

In this case, a monopolar motion probing gradient (MPG) 2501 is applied once in one TR. In the SSFP, an RF signal at a flip angle α and an RF signal at a flip angle −α are alternately transmitted. Therefore, a diffusion weighted image can be obtained through a coherent path during repetition by performing the monopolar MPG once in one cycle of the TR.

Next, a second imaging sequence example in a case of generating an ADC or a diffusion weighted image will be explained with reference to FIG. 26.

Figure 26:
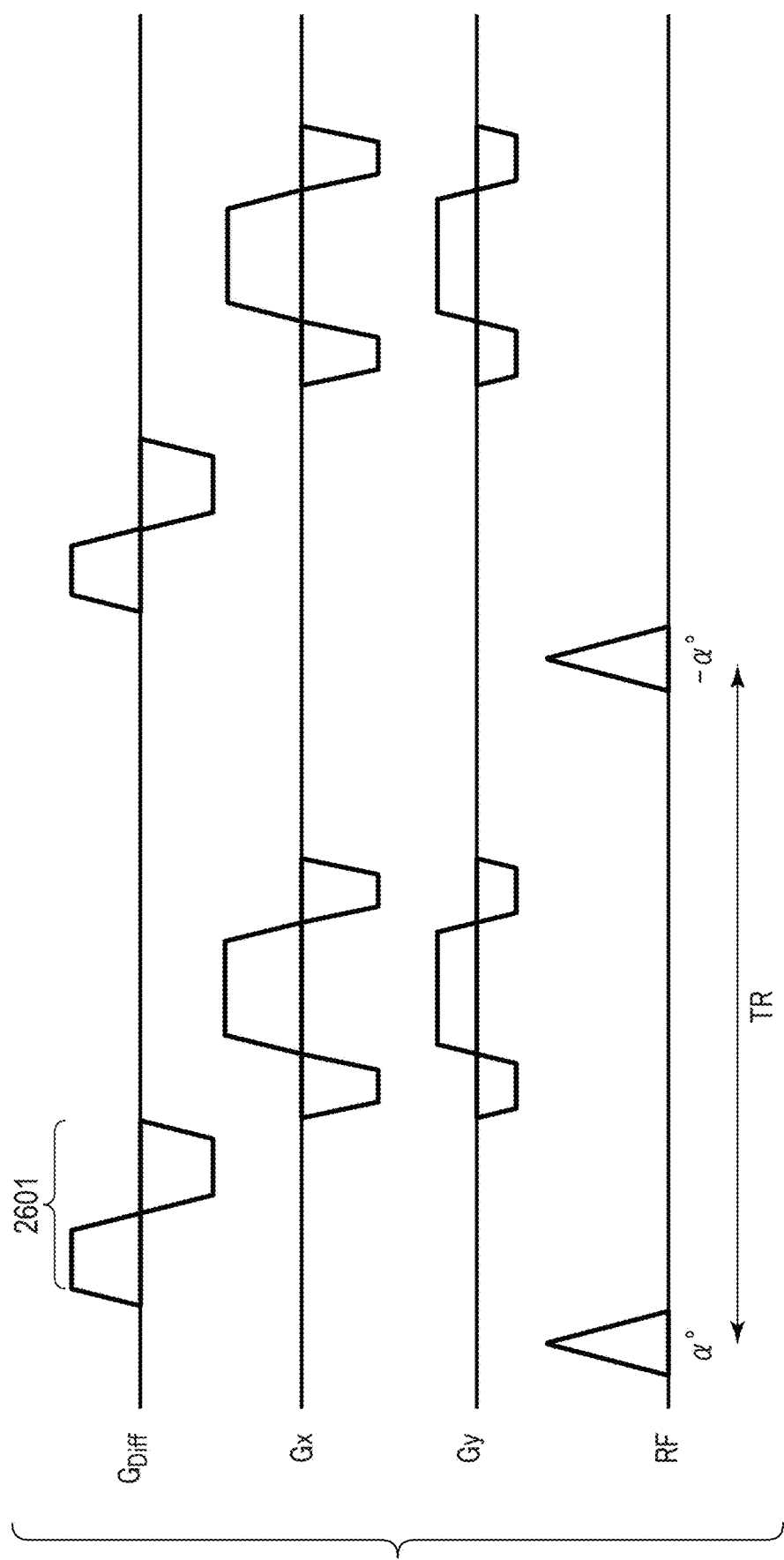
FIG. 26 is a diagram showing a second imaging sequence example in a case of calculating an ADC or a diffusion weighted image as a quantitative value.

FIG. 26 shows a case in which a bipolar MPG 2601 is applied once in one TR. Instead of applying the bipolar MPG 2601, monopolar MPGs in different directions may be alternately applied. Instead of applying the MPG in each TR period, the MPG may be applied after the TR period has elapsed a several times.

As the MPG, a discretionary waveform may be used in combination with q trajectory diffusion MRI (QTI).

The imaging method described above is referred to as Diffusion-Weighted (DW)-SSFP.

Next, a third imaging sequence example in a case of generating an ADC or a diffusion weighted image will be explained with reference to FIG. 27. The imaging method is referred to as a diffusion preparation bSSFP.

Figure 27:
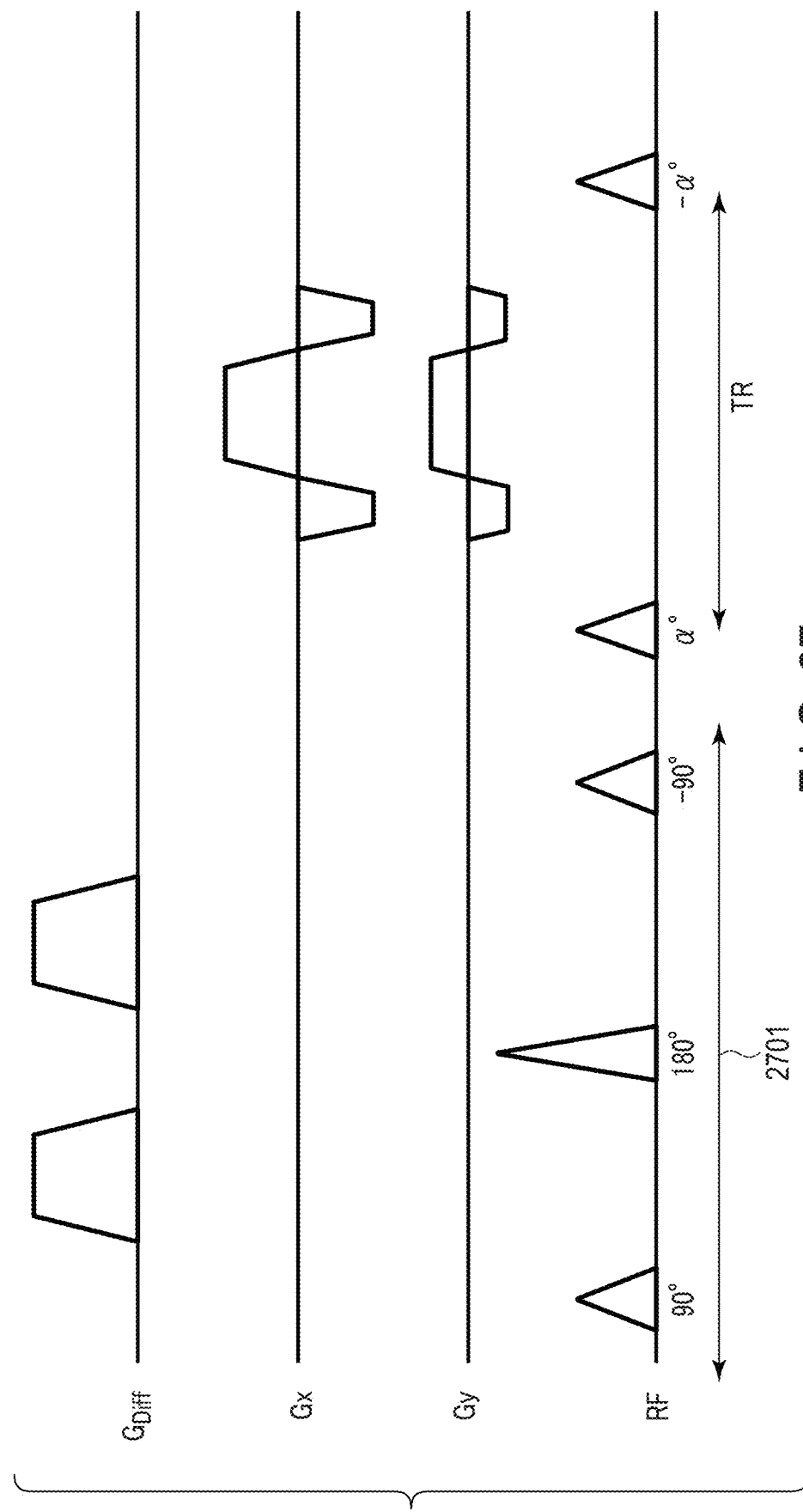
FIG. 27 is a diagram showing a third imaging sequence example in a case of calculating an ADC or a diffusion weighted image as a quantitative value.

In the case shown in FIG. 27, before a normal RF pulse in the bSSFP is transmitted, a diffusion preparation pulse 2701 to contrast the magnetization is transmitted. It is not necessary that all imaging be performed after the diffusion preparation pulse 2701 is transmitted. The sequence may be such that, after imaging of a plurality of times of repetition (TR), the diffusion preparation pulse 2701 is transmitted again.

The MR signals obtained in both of the DW-SSFP and the diffusion preparation bSSFP depend on the PD value, the T1 value, the T2 value, the ADC and various imaging parameters. Therefore, a dictionary is created by calculating the relationship of the signal intensity to the T1 value, the T2 value, and the ADC value in accordance with the imaging sequence. After obtaining a weight coefficient from the dictionary, the multilayered network is learned by inputting the sparse low-rank k-space data set, so that the full low-rank k-space data set is output in the same manner as in the case of estimating only the T1 value and the T2 value. As a result, the ADC and subsequently, the diffusion weighted image can be generated.

To increase the estimation accuracy of the ADC value, it is preferable to perform two or more kinds of imaging while changing the intensity of the MPG pulse. It is also preferable to perform imaging with an MPG pulse intensity of zero.

According to the fourth embodiment described above, the medical data processing apparatus can perform the optimization processing for various imaging methods, such as the three-dimensional imaging or the imaging for diffusion weighted images. By using the imaging sequence necessary to calculate quantitative values, desired quantitative values can be generated at a high speed with high accuracy.

Fifth Embodiment

Figure 28:
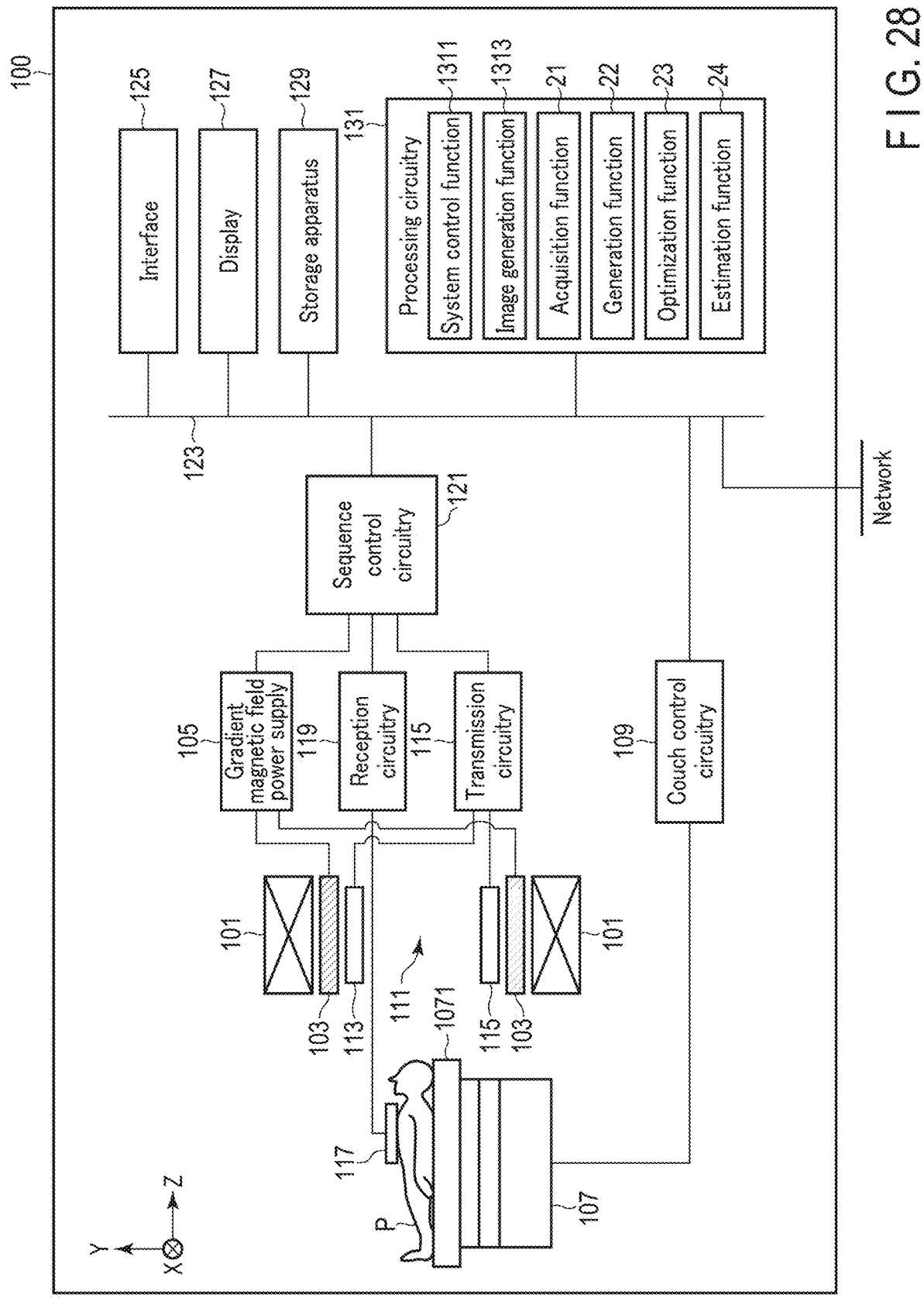
FIG. 28 is a diagram showing an overall configuration of a magnetic resonance imaging apparatus including a medical data processing apparatus.

According to the fifth embodiment, an overall configuration of a magnetic resonance imaging apparatus that includes the medical data processing apparatus of the preceding embodiments will be explained with reference to FIG. 28. FIG. 28 is a diagram showing a configuration of the magnetic resonance imaging (MRI) apparatus 100 of the present embodiment.

As shown in FIG. 28, the MRI apparatus 100 includes a static magnetic field magnet 101, a gradient coil 103, a gradient magnetic field power supply 105, a couch 107, couch control circuitry 109, a transmitter coil 115, transmission circuitry 113, a receiver coil 117, reception circuitry 119, sequence control circuitry 121, a bus 123, an interface 125, a display 127, a storage 129, and processing circuitry 131. The MRI apparatus 100 may have a hollow, cylindrical-shaped shim coil provided between the static magnetic field magnet 101 and the gradient coil 103.

The static magnetic field magnet 101 is a magnet formed in a hollow, approximately cylindrical shape. The static field magnet 101 is not necessarily in an approximately cylindrical shape; it may be formed in an open shape. The static magnetic field magnet 101 generates a uniform static magnetic field in the inner space. For example, a superconducting magnet or the like is used as the static magnetic field magnet 101.

The gradient coil 103 is a hollow cylindrical coil. The gradient coil 103 is provided inside the static magnetic field magnet 101. The gradient coil 103 is a combination of three coils corresponding to X, Y, Z-axes orthogonal to one another. The Z-axis direction is the same direction as the direction of the static magnetic field. The Y-axis direction is a vertical direction, and the X-axis direction is a direction perpendicular to each of the Z-axis and the Y-axis. The three coils of the gradient coil 103 individually receive an electric current from the gradient magnetic field power supply 105 and respectively generate gradient magnetic fields in which magnetic field intensity changes along each of the X-, Y-, and Z-axes.

The gradient magnetic fields along each of the X-, Y- and Z-axes generated by the gradient coil 103 respectively form, for example, a gradient magnetic field for frequency encoding (readout gradient field), a gradient magnetic field for phase encoding, and a gradient magnetic field for slice selection. The slice selection gradient field is used to determine an imaging slice. The phase encode gradient field is used to change the phase of MR signals in accordance with spatial positions. The frequency encode gradient field is used to change the frequency of MR signals in accordance with spatial positions.

The gradient magnetic field power supply 105 is a power supply device that supplies a current to the gradient coil 103 under the control of the sequence control circuitry 121.

The couch 107 is an apparatus having a couch top 1071 on which a subject P is laid. The couch 107 inserts the couch top 1071 on which the subject P is placed into a bore 111 under the control of the couch control circuitry 109. The couch 107 is installed in, for example, an examination room where the MRI apparatus 100 is installed, in such a manner that the longitudinal axis of the couch 107 is parallel to the center axis of the static magnetic field magnet 101.

The couch control circuitry 109 is circuitry that controls the couch 107, and drives the couch 107 in response to operator's instructions via the interface 125 to move the couch top 1071 in the longitudinal direction and vertical direction.

The transmitter coil 115 is an RF coil provided inside the gradient coil 103. The transmitter coil 115 is supplied with the RF pulse from the transmission circuitry 113 and generates a transmit RF wave corresponding to a radio frequency magnetic field. The transmitter coil 115 is a whole body coil (WBC), for example. The WBC may be used as a transmitter/receiver coil. A cylindrical RF shield is arranged between the WBC and the gradient coil 103 to magnetically separate these coils.

The transmission circuitry 113 supplies an RF pulse corresponding to a Larmor frequency, etc. to the transmitter coil 115 under the control of the sequence control circuitry 121.

The receiver coil 117 is an RF coil provided inside the gradient coil 103. The receiver coil 117 receives an MR signal that the radio frequency magnetic field causes the subject P to emit. The receiver coil 117 outputs the received MR signal to the reception circuitry 119. The receiver coil 117 is a coil array including, for example, one or more, typically, a plurality of coil elements. The receiver coil 117 is, for example, a phased array coil.

The reception circuitry 119 generates a digital MR signal which is digitized complex data, based on the MR signal output from the receiver coil 117, under the control of the sequence control circuitry 121.

Specifically, the reception circuitry 119 performs various types of signal processing on the MR signal output from the receiver coil 117, and then performs analog-to-digital (A/D) conversion on the data subjected to the various types of signal processing. The reception circuitry 119 samples the A/D-converted data. The reception circuitry 119 thereby generates a digital MR signal (hereinafter referred to as MR data). The reception circuitry 119 outputs the generated MR data to the sequence control circuitry 121.

The sequence control circuitry 121 controls the gradient magnetic field power supply 105, the transmission circuitry 113, the reception circuitry 119, etc. in accordance with an examination protocol that is output from the processing circuitry 131, and performs imaging on the subject P. The examination protocol has different pulse sequences in accordance with a type of examination.

The examination protocol defines the magnitude of the current supplied from the gradient magnetic field power supply 105 to the gradient coil 103, timing of the supply of the current from the gradient magnetic field power supply 105 to the gradient coil 103, the magnitude of the RF pulse supplied from the transmission circuitry 113 to the transmitter coil 115, timing of the supply of the RF pulse from the transmission circuitry 113 to the transmitter coil 115, timing of reception of the MR signal at the receiver coil 117, etc.

The bus 123 is a transmission path for transmitting data between the interface 125, the display 127, the storage 129, and the processing circuitry 131. The bus 123 may be connected via, for example, a network to various physiological signal measuring devices, an external storage apparatus, and various modalities. For example, an electrocardiograph (not shown) is connected to the bus as a physiological signal measuring device.

The interface 125 has circuitry for receiving various types of instructions and information input from an operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device provided separately from the MRI apparatus 100 and outputs the received electrical signal to various circuits.

The display 127 displays, for example, various magnetic resonance (MR) images generated by an image generation function, and various types of information relating to imaging and image processing, under the control of a system control function 1311 in the processing circuitry 131. The display 127 is a display device, for example, a CRT display, a liquid crystal display, an organic EL display, an LED display, a plasma display, or any other display or a monitor known in this technical field.

The storage 129 stores, for example, MR data filled in the k-space via an image generation function 1313, and image data generated by the image generation function 1313. The storage 129 stores various types of examination protocols, and conditions for imaging etc., including a plurality of imaging parameters that define examination protocols. The storage 129 stores programs corresponding to various functions performed by the processing circuitry 131. The storage 129 is, for example, a semiconductor memory element, such as a random access memory (RAM) and a flash memory, a hard disk drive, a solid state drive, an optical disk, etc. The storage 129 may also be, for example, a drive that performs writing and reading of various types of information on a CD-ROM drive, a DVD drive, or a portable memory medium such as a flash memory.

The processing circuitry 131 includes, as hardware resources, a processor and a memory such as a read-only memory (ROM) and a RAM, which are not shown, and collectively controls the MRI apparatus 100. The processing circuitry 131 includes a system control function 1311, an image generation function 1313, an acquisition function 21, a generation function 22, an optimization function 23, and an estimation function 24. Since the acquisition function 21, the generation function 22, the optimization function 23, and the estimation function 24 are the same as those of the medical data processing apparatus 1 of the above embodiments, redundant descriptions thereof will be omitted.

These various functions of the processing circuitry 31 are stored in the storage 129 in a form of program executable by a computer. The processing circuitry 131 is a processor that reads programs corresponding to the various functions from the storage 129 and executes them to realize functions corresponding to the programs. In other words, the processing circuitry 131 that has read the programs have, for example, the functions shown in the processing circuitry 131 in FIG. 1.

FIG. 1 illustrates the case where the various functions are realized in the single processing circuit 131; however, the processing circuitry 131 may be constituted by a combination of a plurality of independent processors, and the functions may be realized by the processors executing the programs. In other words, the above-described functions may be configured as programs, and executed by a single processing circuit; alternatively, a specific function may be implemented in a dedicated independent program execution circuit.

The term "processor" used in the above description means, for example, a central processing unit (CPU), a graphics processing unit (GPU), or an application specific integrated circuit (ASIC), a programmable logic device (for example, a simple programmable logic device: SPLD), a complex programmable logic device (CPLD), and a field programmable gate array (FPGA).

The processor realizes various functions by reading and executing programs stored in the storage 129. The programs may be directly integrated in a circuit of the processor, instead of being stored in the storage 129. In this case, the processor realizes functions by reading and executing programs which are integrated in the circuit. Similarly, each of the couch control circuitry 109, the transmission circuitry 113, the reception circuitry 119, and the sequence control circuitry 121, etc. are also configured as an electronic circuit, such as the above processor.

The processing circuitry 131 controls the MRI apparatus 100 by the system control function 1311. Specifically, the processing circuitry 131 reads the system control program stored in the storage 129, loads it in the memory, and controls each circuitry of the MRI apparatus 100 in accordance with the loaded system control program. For example, the processing circuitry 131 reads an examination protocol from the storage 129 by the system control function 1311 based on an imaging condition input by the operator via the interface 125. The processing circuitry 131 may generate the examination protocol based on the imaging condition. The processing circuitry 131 transmits the examination protocol to the sequence control circuitry 121 to control imaging of the subject P.

In a case of applying an excitation pulse including a plurality of RF pulses, the processing circuitry 131 sets, through a setting function 1315, an excitation pulse sequence, in which the excitation pulse including an inversion pulse is applied between at least a set of RF pulses of the plurality of RF pulses, and a spoiler gradient magnetic field is applied while the inversion pulse is applied. The inversion pulse is a pulse to invert the positivity and negativity of the vertical magnetization, and is also referred to as the 180° pulse or refocus pulse. The spoiler gradient magnetic field is a gradient magnetic field that disperses the horizontal magnetization, and is also referred to as the flop spoiler.

Through the system control function 1311, the processing circuitry 131 applies an excitation pulse in accordance with the excitation pulse sequence, and performs a control of applying the gradient magnetic field including the spoiler gradient magnetic field. After executing the excitation pulse sequence, the processing circuitry 131 collects the MR signals from the subject P in accordance with a data collection sequence, which is a pulse sequence for collecting various data, and generates MR data through the system control function 1311.

Through the image generation function 1313, the processing circuitry 131 fills the k-space in the readout direction with MR data in accordance with the intensity of the readout gradient magnetic field. The processing circuitry 131 performs the Fourier transform on the MR data that the k-space was filled with, to generate an MR image. For example, the processing circuitry 131 can generate a magnitude image from complex MR data. The processing circuitry 131 can also generate a phase image by using real part data and imaginary part data of the complex MR data. The processing circuitry 131 outputs the MR image such as the magnitude image or the phase image to the display 127 and the storage 129.

According to the fifth embodiment described above, a full low-rank image can be generated at a high speed with high accuracy, and can provide an MRI apparatus having various quantitative values based on the full low-rank image.

According to at least one of the above-described embodiments, it is possible to perform estimation at a high speed with high reliability.

Furthermore, the functions described in connection with the above embodiments may be implemented by, for example, installing a program for executing the processing in a computer, such as a workstation, etc., and expanding the program in a memory. The program that causes the computer to execute the processing can be stored and distributed by means of a storage medium, such as a magnetic disk (a hard disk, etc.), an optical disk (CD-ROM, DVD, a Blu-ray (registered trademark) disk, etc.), and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A medical data processing apparatus comprising processing circuitry configured to:
acquire a plurality of first data pieces obtained by sparse sampling;
generate a plurality of first compressed data pieces lower in number than the plurality of first data pieces by multiplying the plurality of first data pieces by each of sets of weight coefficients and adding each of the multiplied first data pieces, the number of sets of weight coefficients being smaller than the number of the first data pieces;
perform first processing of outputting one or more second compressed data pieces by applying a trained model to the first compressed data pieces, the trained model being trained by receiving first compressed data pieces generated from first data pieces obtained by sparse sampling for an observation target and outputting at least one of plurality of second compressed data pieces generated from a plurality of second data pieces obtained by full sampling for the observation target; and
repeatedly perform the first processing and a second processing until a convergence condition is satisfied, the second processing correcting the first compressed data pieces based on a comparison between estimated first data pieces estimated from the second compressed data pieces and the first data pieces.

2. The apparatus of claim 1, wherein the weight coefficients are determined based on coefficients obtained by compressing a dimension of the second data pieces.

3. The apparatus of claim 1, wherein the processing circuitry repeatedly performs the first processing and the second processing, until the convergence condition is satisfied by using an alternating direction method of multipliers (ADMM).

4. The apparatus of claim 1, the processing circuitry estimates a quantitative value from the output second compressed data pieces.

5. The apparatus of claim 1, wherein the processing circuitry uses the weight coefficients generated by using dimensional compression method including singular value decomposition and principal component analysis.

6. The apparatus of claim 1, wherein the first data pieces and the second data pieces are one of image data, k-space data, sinogram space data or hybrid space data.

7. The apparatus of claim 6, wherein
the first data pieces are decimation data in which slices are skipped in a slice selecting direction in k-space, and
the processing circuitry interpolates the decimation data by parallel imaging.

8. The apparatus of claim 1, wherein
the pieces of first data are respectively a plurality of sets of data based on a signal acquired by respective coils; and
the processing circuitry is configured to:
generate the first compressed data for each of the sets of data; and
generate at least one of the pieces of second compressed data from the first compressed data of the sets in accordance with the trained model trained to generate the second compressed data from the pieces of first compressed data as an input.

9. The medical data processing apparatus of claim 8, wherein the sets of data are sets of data based on signals of virtual coils integrating a plurality of coils.

10. A medical data processing method comprising:
acquiring a plurality of first data pieces obtained by sparse sampling;
generating a plurality of first compressed data pieces lower in number than the plurality of first data pieces by multiplying the plurality of first data pieces by each of sets of weight coefficients and adding each of the multiplied first data pieces, the number of sets of weight coefficients being smaller than the number of the first data pieces;
performing first processing of outputting one or more second compressed data pieces by applying a trained model to the first compressed data pieces, the trained model being trained by receiving first compressed data pieces generated from first data pieces obtained by sparse sampling for an observation target and outputting at least one of plurality of second compressed data pieces generated from a plurality of second data pieces obtained by full sampling for the observation target; and
repeatedly performing the first processing and a second processing until a convergence condition is satisfied, the second processing correcting the first compressed data pieces based on a comparison between estimated first data pieces estimated from the second compressed data pieces and the first data pieces.

11. The method of claim 10, wherein the weight coefficients are determined based on coefficients obtained by compressing a dimension of the second data pieces.

12. The method of claim 10, wherein the repeatedly performing the first processing and the second processing is performed until the convergence condition is satisfied by using an alternating direction method of multipliers (ADMM).

13. The method of claim 10, further comprising estimating a quantitative value from the output second compressed data pieces.

14. The method of claim 10, wherein the weight coefficients are generated by using a dimensional compression method including singular value decomposition and principal component analysis.

15. The method of claim 10, wherein the first data pieces and the second data pieces are one of image data, k-space data, sinogram space data or hybrid space data.

16. The method of claim 15, wherein the first data pieces are decimation data in which slices are skipped in a slice selecting direction in k-space, and the method further comprising interpolating the decimation data by parallel imaging.

17. The method of claim 1, wherein
the pieces of first data are respectively a plurality of sets of data based on a signal acquired by respective coils; and
the method further comprises:
generating the first compressed data for each of the sets of data; and
generating at least one of the pieces of second compressed data from the first compressed data of the sets in accordance with the trained model trained to generate the second compressed data from the pieces of first compressed data as an input.

18. A magnetic resonance imaging apparatus comprising:
a collection unit configured to collect a plurality of first magnetic resonance (MR) data pieces by imaging a subject in accordance with an imaging sequence corresponding to sparse sampling; and
processing circuitry configured to:
- generate a plurality of first compressed MR data pieces lower in number than the plurality of first MR data pieces by multiplying the plurality of first MR data pieces by each of sets of weight coefficients and adding each of the multiplied first MR data pieces, the number of sets of weight coefficients being smaller than the number of the first MR data pieces;
- perform first processing of outputting one or more second MR compressed data pieces by applying a trained model to the first compressed MR data pieces, the trained model being trained by receiving first compressed MR data pieces generated from first MR data pieces obtained by sparse sampling for an observation target and outputting at least one of plurality of second compressed MR data pieces generated from a plurality of second MR data pieces obtained by full sampling for the observation target; and
- perform the first processing and a second processing until a convergence condition is satisfied, the second processing correcting the first compressed data pieces based on a comparison between estimated first data pieces estimated from the second compressed data pieces and the first data pieces.

19. A medical data processing apparatus comprising processing circuitry configured to:
- acquire a plurality of first data pieces obtained by sparse sampling for an observation target;
- generate a plurality of first compressed data pieces lower in number than the plurality of first data pieces by multiplying the plurality of first data pieces by each of sets of weight coefficients and adding each of the multiplied data pieces, the number of sets of weight coefficients being smaller than the number of the first data pieces; and
- output one or more second compressed data pieces by receiving the first compressed data pieces, the one or more second compressed data pieces being generated from a plurality of second data pieces considered as full sampling data for the observation target.

* * * * *